(12) United States Patent
Yang et al.

(10) Patent No.: US 9,099,631 B2
(45) Date of Patent: Aug. 4, 2015

(54) SEMICONDUCTOR LIGHT-EMITTING DEVICE AND METHOD OF MANUFACTURING THE SAME

(71) Applicant: SAMSUNG ELECTRONICS CO., LTD., Suwon-Si, Gyeonggi-do (KR)

(72) Inventors: Jong-In Yang, Suwon-Si (KR);
Tae-Hyung Kim, Hwaseong-Si (KR);
Si-Hyuk Lee, Anyang-Si (KR);
Sang-Yeob Song, Suwon-Si (KR);
Cheol-Soo Sone, Seoul (KR);
Hak-Hwan Kim, Suwon-Si (KR);
Jin-Hyun Lee, Suwon-Si (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 0 days.

(21) Appl. No.: 14/594,020

(22) Filed: Jan. 9, 2015

(65) Prior Publication Data
US 2015/0125983 A1 May 7, 2015

Related U.S. Application Data

(62) Division of application No. 14/483,036, filed on Sep. 10, 2014, now Pat. No. 8,975,655, which is a division of application No. 13/179,325, filed on Jul. 8, 2011, now Pat. No. 8,872,205.

(30) Foreign Application Priority Data

Jul. 8, 2010 (KR) .......................... 10-2010-0065967
Aug. 5, 2010 (KR) .......................... 10-2010-0075670

(51) Int. Cl.
*H01L 21/00* (2006.01)
*H01L 33/62* (2010.01)
*H01L 33/00* (2010.01)

(52) U.S. Cl.
CPC .............. *H01L 33/62* (2013.01); *H01L 33/005* (2013.01); *H01L 33/0025* (2013.01); *H01L 2933/0066* (2013.01)

(58) Field of Classification Search
USPC ............... 438/22, 25, 26, 27, 29; 257/98–100
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

DE 102007062046 A1 6/2009
EP 2197051 A2 6/2010
(Continued)

OTHER PUBLICATIONS

US 8,314,430, 11/2012, Illek et al. (withdrawn).
(Continued)

*Primary Examiner* — Samuel Gebremariam
(74) *Attorney, Agent, or Firm* — McDermott Will & Emery LLP

(57) ABSTRACT

A semiconductor light-emitting device, and a method of manufacturing the same. The semiconductor light-emitting device includes a first electrode layer, an insulating layer, a second electrode layer, a second semiconductor layer, an active layer, and a first semiconductor layer that are sequentially stacked on a substrate, a first contact that passes through the substrate to be electrically connected to the first electrode layer, and a second contact that passes through the substrate, the first electrode layer, and the insulating layer to communicate with the second electrode layer. The first electrode layer is electrically connected to the first semiconductor layer by filling a contact hole that passes through the second electrode layer, the second semiconductor layer, and the active layer, and the insulating layer surrounds an inner circumferential surface of the contact hole to insulate the first electrode layer from the second electrode layer.

50 Claims, 36 Drawing Sheets

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,828,596 B2 | 12/2004 | Steigerwald et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,095,061 B2 | 8/2006 | Steigerwald et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,652,304 B2 | 1/2010 | Steigerwald et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,476,644 B2 | 7/2013 | Illek et al. |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,975,655 B2 | 3/2015 | Yang et al. |
| 2006/0027339 A1 | 2/2006 | Hsu |
| 2006/0273339 A1 | 12/2006 | Steigerwald et al. |
| 2007/0096130 A1 | 5/2007 | Schiaffino et al. |
| 2007/0262338 A1 | 11/2007 | Higashi et al. |
| 2009/0101886 A1 | 4/2009 | Chang |
| 2009/0146165 A1 | 6/2009 | Hasnain et al. |
| 2009/0283787 A1 | 11/2009 | Donofrio et al. |
| 2010/0012963 A1 | 1/2010 | Hwan |
| 2012/0322186 A1 | 12/2012 | Rode et al. |

FOREIGN PATENT DOCUMENTS

| | | |
|---|---|---|
| JP | 08-255926 A | 10/1996 |
| JP | 2004-297097 A | 10/2004 |
| KR | 10-0652133 B1 | 11/2006 |
| KR | 10-2009-0010623 A | 1/2009 |
| KR | 10-2010-0044726 A | 4/2010 |
| WO | 2008-131736 A1 | 11/2008 |

OTHER PUBLICATIONS

Extended European Search Report issued in corresponding European Application No. 11172951.3, dated Apr. 3, 2014.

Extended European Search Report issued in corresponding European Application No. 11173035.4, dated Apr. 14, 2014.

Extended European Search Report issued in European Application No. 11172952.1-1551 dated May 30, 2014.

United States Office Action issued in U.S. Appl. No. 13/179,325 dated Mar. 27, 2014.

United States Notice of Allowance issued in U.S. Appl. No. 13/179,325 dated Jun. 11, 2014.

Chinese Office Action issued in Chinese Application No. 201110196557.3 dated Dec. 31, 2014.

U.S. Office Action issued in related U.S. Appl. No. 14/594,039 on Mar. 31, 2015; 10 pages.

United States Patent US 9,099,631 B2

SEMICONDUCTOR LIGHT-EMITTING DEVICE AND METHOD OF MANUFACTURING THE SAME

CROSS-REFERENCE TO RELATED APPLICATIONS

This is a Divisional of U.S. patent application Ser. No. 14/483,036 filed on Sep. 10, 2014, which is a Divisional of U.S. patent application Ser. No. 13/179,325, filed on Jul. 8, 2011, now U.S. Pat. No. 8,872,205, which claims priority of Korean Patent Application Nos. 10-2010-0065967 filed on Jul. 8, 2010, 10-2010-0075670 filed on Aug. 5, 2010, and 10-2010-0079225 filed on Aug. 17, 2010, the disclosures of which are incorporated herein in its entirety by reference.

BACKGROUND

1. Field

The present disclosure relates to light-emitting devices in which an electrode for supplying current to a semiconductor layer light-emitting device is formed on lower surface of a substrate, and methods of manufacturing the light-emitting devices.

2. Description of the Related Art

In general, a light-emitting device such as a light-emitting diode (LED) has a junction structure between a p-type semiconductor and an n-type semiconductor. Such a light-emitting device may be classified into a horizontal light-emitting device and a vertical light-emitting device according to a position of an electrode connected to a semiconductor layer.

Since a horizontal light-emitting device forms an electrode by removing a part of a light-emitting area, luminous efficiency may be reduced. Also, since a horizontal light-emitting device requires wire bonding, a wire may be short-circuited due to heat generated in the horizontal light-emitting device.

In general, in a semiconductor light-emitting device, a conductive substrate is disposed under a semiconductor layer, an electrode is disposed on another semiconductor layer, and wire bonding is performed. Since the electrode has a size large enough for current spreading, light extraction may be limited. Since light is absorbed by the electrode, luminous efficiency may be reduced. Also, wire bonding for supplying current to the electrode is required.

SUMMARY

Provided are semiconductor light-emitting devices that may prevent a light-emitting area from being reduced by disposing a p-type electrode and an n-type electrode under a semiconductor structure and may be packaged without wire bonding, and methods of manufacturing the semiconductor light-emitting devices.

Additional aspects will be set forth in part in the description which follows and, in part, will be apparent from the description, or may be learned by practice of the presented embodiments.

According to an aspect of the present invention, a semiconductor light-emitting device includes: a first electrode layer, an insulating layer, a second electrode layer, a second semiconductor layer, an active layer, and a first semiconductor layer that are sequentially stacked on a substrate; and a first contact that passes through the substrate to be electrically connected to the first electrode layer, and a second contact that passes through the substrate, the first electrode layer, and the insulating layer to communicate with the second electrode layer, wherein the first electrode layer is filled in a contact hole that passes through the second electrode layer, the second semiconductor layer, and the active layer to be electrically connected to the first semiconductor layer, wherein the insulating layer disposes on an inner circumferential surface of the contact hole to insulate the first electrode layer from the second electrode layer.

The contact hole may includes a plurality of contact holes, and each of the plurality of contact holes may be filled with the first electrode layer.

An insulating layer may be formed on an outer circumferential surface of the second contact to insulate at least the second contact and the first electrode layer.

The second electrode layer may be a reflective layer that reflects light generated by the active layer.

The second electrode layer may be formed of at least one material selected from the group consisting of silver (Ag), aluminum (Al), platinum (Pt), nickel (Ni), palladium (Pd), titanium (Ti), gold (Au), iridium (Ir), tungsten (W), stannum (Sn), an oxide thereof, and a mixture thereof.

The substrate may be formed of any one material selected from the group consisting of alumina, aluminum nitride, sapphire, and polymer.

The substrate may be a conductive substrate, and an insulating layer may be formed on inner circumferential surfaces of through-holes in which the first contact and the second contact are formed and on a surface of the substrate.

The substrate may include any one selected from the group consisting of silicon (Si), germanium (Ge), and Si containing aluminum (Al).

According to another aspect of the present invention, a semiconductor light-emitting device includes: a first electrode layer, a first insulating layer, a second electrode layer, a second semiconductor layer, an active layer, and a first semiconductor layer that are sequentially stacked on a substrate; a first electrode pad that is formed on a portion of the first electrode layer; a second insulating layer that is formed on a remaining portion of the first electrode layer; a second electrode pad that is formed on the second electrode layer to extend toward the second insulating layer; and a first contact that passes through the substrate to be electrically connected to the first electrode pad, and a second contact that passes through the substrate to be electrically connected to the second electrode layer, wherein the first electrode layer is filled in a contact hole that passes through the second electrode layer, the second semiconductor layer, and the active layer to be electrically connected to the first semiconductor layer, and the first insulating layer disposes on an inner circumferential surface of the contact hole to insulate the first electrode layer from the second electrode layer.

According to another aspect of the present invention, a method of manufacturing a semiconductor light-emitting device includes: sequentially forming a first semiconductor layer, an active layer, and a second semiconductor layer on a first substrate; forming a contact hole through which the first semiconductor layer is exposed from the second semiconductor layer, and forming a contact layer in the contact hole to be connected to the first semiconductor layer; forming a second electrode layer on the second semiconductor layer to surround the contact hole; forming a first insulating layer on the second electrode layer; forming a first electrode layer on the first insulating layer to be connected to the contact layer; adhering a second substrate to the first electrode layer and removing the first substrate; forming a first through-hole that is connected to the first electrode layer and a second through-hole that is connected to the second electrode layer from an exposed surface of the second substrate; and forming a first contact and a second contact that are respectively connected to the first electrode layer and the second electrode layer by filling the first through-hole and the second through-hole with metals.

The forming of the contact hole may further include: forming a second insulating layer that covers the contact hole; and exposing the first semiconductor layer by etching a portion of the second insulating layer formed on a bottom of the contact hole, and the forming of the contact layer includes forming the contact layer on the exposed first semiconductor layer.

The forming of the contact hole and the contact layer may include forming a plurality of contact holes and a plurality of contact layers.

The forming of the second electrode layer may include: forming a third insulating layer on the second semiconductor layer; exposing the second semiconductor layer by removing the third insulating layer that surrounds the contact hole; and forming the second electrode layer on the exposed second semiconductor layer.

The forming of the first electrode layer may include: etching the first insulating layer to expose the contact layer; and forming the first electrode layer to cover the exposed contact layer.

The forming of the second through-hole may further include forming a fourth insulating layer on an inner circumferential surface of the second through-hole.

According to another aspect of the present invention, a method of manufacturing a semiconductor light-emitting device includes: sequentially stacking a first semiconductor layer, an active layer, and a second semiconductor layer on a first substrate; forming a contact hole through which the first semiconductor layer is exposed from the second semiconductor layer, and forming a contact layer in the contact hole to be connected to the first semiconductor layer; forming a second electrode layer on the second semiconductor layer to surround the contact hole; forming a first insulating layer on the second electrode layer; forming a first electrode layer on the first insulating layer to be connected to the contact layer; forming a first through-hole in a second substrate to be connected to the first electrode layer, and a second through-hole in the second substrate to be connected to the second electrode layer; forming a first contact and a second contact that are respectively connected to the first electrode layer and the second electrode layer by filling the first through-hole and the second through-hole with metals; and forming a third contact that is connected to the second electrode layer from an exposed surface of the first electrode layer and is insulated from the first electrode layer; adhering the second substrate to the first electrode layer such that the third contact contacts the second contact; and removing the first substrate.

According to another aspect of the present invention, a method of manufacturing a semiconductor light-emitting device includes: sequentially forming a first semiconductor layer, an active layer, a second semiconductor layer, and a second electrode layer on a first substrate; forming a contact hole through which the first semiconductor layer is exposed from the second electrode layer; forming a first insulating layer on the second electrode layer to cover an inner circumferential surface of the contact hole; exposing the first semiconductor layer by etching a bottom of the contact hole; forming a first electrode layer on the first insulating layer to contact the exposed first semiconductor layer; adhering a second substrate to the first electrode layer and removing the first substrate; forming a first through-hole connected to the first electrode layer and a second through-hole connected to the second electrode layer from an exposed surface of the second substrate; and forming a first contact and a second contact respectively connected to the first electrode layer and the second electrode layer by filling the first through-hole and the second through-hole with metals.

According to another aspect of the present invention, a method of manufacturing a semiconductor light-emitting device includes: sequentially forming a first semiconductor layer, an active layer, and a second semiconductor layer on a first substrate; forming a contact hole through which the first semiconductor layer is exposed from the second semiconductor layer, and forming a contact layer in the contact hole to be connected to the first semiconductor layer; forming a second electrode layer on the second semiconductor layer to surround the contact hole; forming a first insulating layer on the second electrode layer; forming a first electrode layer on the first insulating layer to be connected to the contact layer in a second region other than a first region of the second electrode layer; forming a second insulating layer to cover the first electrode layer; forming a second electrode pad connected to the second electrode layer in the first region on the second insulating layer; forming a first electrode pad in the second region to be spaced apart from the second electrode pad and to be connected to the first electrode layer; forming a first contact and a second contact in a second substrate by filling through-holes spaced apart from each other in the second substrate with metals; and adhering the second substrate to the first contact and the second contact such that the first electrode pad and the second electrode pad are respectively connected to the first contact and the second contact.

According to another aspect of the present invention, a method of manufacturing a semiconductor light-emitting device includes: sequentially forming a first semiconductor layer, an active layer, a second semiconductor layer, and a second electrode layer on a first substrate; forming a contact hole through which the first semiconductor layer is exposed from the second electrode layer; forming a first insulating layer on the second electrode layer to cover an inner circumferential surface of the contact hole; exposing the first semiconductor layer by etching a portion of the first insulating layer formed on a bottom of the contact hole; forming a first electrode layer on the first insulating layer to be connected to the contact layer in a second region other than a first region of the second electrode layer; forming a second insulating layer to cover the first electrode layer; forming a second electrode pad connected to the second electrode layer in the first region on the second insulating layer; forming a first electrode pad in the second region to be spaced apart from the second electrode pad and to be connected to the first electrode layer; forming a first contact and a second contact in a second substrate by filling through-holes spaced apart from each other in the second substrate with metals; and adhering the second substrate to the first contact and the second contact such that the first contact and the second contact are respectively connected to the first electrode pad and the second electrode pad.

According to another aspect of the present invention, a semiconductor light-emitting device includes: a semiconductor structure that includes a first semiconductor layer, an active layer, and a second semiconductor layer; a first electrode layer and a second electrode layer that are disposed on the second semiconductor layer and are respectively electrically connected to the first semiconductor layer and the second semiconductor layer; an insulating layer that is formed on a top surface of the semiconductor structure to insulate the first electrode layer and the second electrode layer; a plating electrode layer that includes a first electrode pad disposed on the first electrode layer and a second electrode pad disposed on the second electrode layer; and an insulating barrier that is disposed between the first electrode pad and the second electrode pad.

The first electrode layer may cover a top of at least one contact hole to be electrically connected to the first semiconductor layer through the at least one contact hole that is formed from the second semiconductor layer to the first semiconductor layer.

The insulating layer may extend to be formed on a side wall of the at least one contact hole so that the first electrode layer is insulated from the second semiconductor layer.

The semiconductor structure may be obtained by removing a predetermined substrate from a gallium nitride-based light-emitting diode stacked on the predetermined substrate.

According to another aspect of the present invention, a semiconductor light-emitting device includes: a semiconductor structure that includes a first semiconductor layer, an active layer, and a second semiconductor layer; a first electrode layer and a second electrode layer that are disposed on the second semiconductor layer and are respectively connected to the first semiconductor layer and the second semiconductor layer; a first insulating layer that is formed on a top surface of the semiconductor structure and insulates the first electrode layer and the second electrode layer; a second insulating layer that covers the first insulating layer, the first electrode layer, and the second electrode layer and exposes a first region where the second electrode layer is located and a second region where the first electrode layer is located; a first metal layer that is connected to the first electrode layer in the second region; a second metal layer that is connected to the first electrode layer in the first region; a plating electrode layer that includes a first electrode pad that is disposed on the first metal layer and a second electrode pad that is disposed on the second metal layer; and an insulating barrier that is disposed between the first electrode pad and the second electrode pad.

According to another aspect of the present invention, a method of manufacturing a semiconductor light-emitting device includes: forming a semiconductor structure by stacking a first semiconductor layer, an active layer, and a second semiconductor layer on a substrate; forming a first electrode layer and a second electrode layer on a top surface of the semiconductor structure to be respectively electrically connected to the first semiconductor layer and the second semiconductor layer; coating an insulating layer that exposes a part of a region where the first electrode layer is located and a part of a region where the second electrode layer is located; forming a first electrode pad and a second electrode pad by plating a first electrode region through which the first electrode layer is exposed and a second electrode region through which the second electrode layer is exposed; forming an insulating barrier by filling an insulating material in a boundary region between the first electrode and the second electrode pad; and removing the substrate.

The forming of the first electrode layer and the second electrode layer may include: forming at least one contact hole from the second semiconductor layer to the first semiconductor layer; forming a passivation layer on the second semiconductor layer and the at least one contact hole; exposing a portion of the first semiconductor layer by removing a portion of the passivation layer located on a bottom of the at least one contact hole; forming a first electrode layer on the exposed portion of the first semiconductor layer; removing a portion of the passivation layer other than a portion that surrounds the first electrode layer on the second semiconductor layer; and forming a second electrode layer on an exposed area by the removing the portion of the passivation layer.

The coating of the insulating layer may include: coating an insulating layer on entire top surfaces of the first electrode layer, the second electrode layer, and the semiconductor structure; and removing a portion of the insulating layer where the first electrode layer and the second electrode layer are located.

The forming of the first electrode pad and the second electrode pad may include: forming a photoresist in a boundary region between the first electrode region and the second electrode region; forming the first electrode pad and the second electrode pad by performing plating with the photoresist therebetween; and removing the photoresist.

The forming of the first electrode pad and the second electrode pad may further include forming a seed layer on the first electrode region and the second electrode region for performing the plating.

The method may further include planarizing top surfaces of the first electrode, the second electrode, and the insulating barrier.

According to another aspect of the present invention, a method of manufacturing a semiconductor light-emitting device includes: forming a semiconductor structure by stacking a first semiconductor layer, an active layer, and a second semiconductor layer on a substrate; forming a first electrode layer and a second electrode layer on a top surface of the semiconductor structure to be respectively electrically connected to the first semiconductor layer and the second semiconductor layer; forming a first insulating layer that exposes a part of a region where the first electrode layer is located and a part of a region where the second electrode layer is located; forming a second insulating layer that covers the first insulating layer, the first electrode layer, and the second electrode layer; exposing a first region where the first electrode layer is located and a second region where the second electrode layer is located by etching the second insulating layer; respectively forming a first metal layer and a second metal layer in the first region and the second region; respectively forming a first electrode pad and a second electrode pad by plating the first metal layer and the second metal layer; forming an insulating barrier by filling an insulating material in a boundary region between the first electrode pad and the second electrode pad; and removing the substrate.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
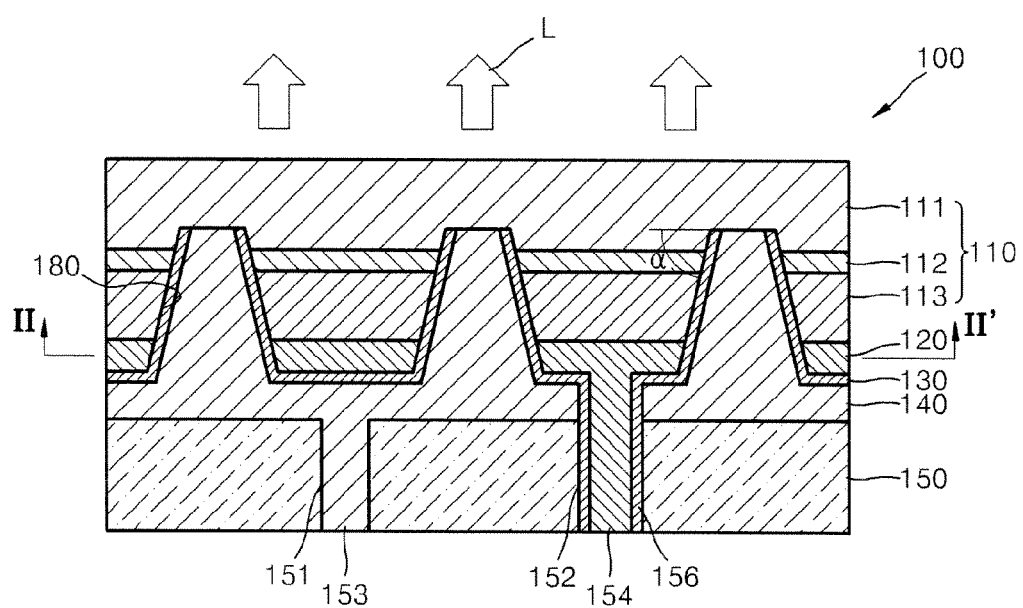
FIG. 1A is a cross-sectional view illustrating a semiconductor light-emitting device according to an embodiment of the present invention.

The present invention will now be described more fully with reference to the accompanying drawings, in which exemplary embodiments of the invention are shown. Thicknesses of layers or regions illustrated in the drawings are exaggerated for clarity. In the drawings, the same elements are denoted by the same reference numerals and a detailed explanation thereof will not be given.

Figure 1B:
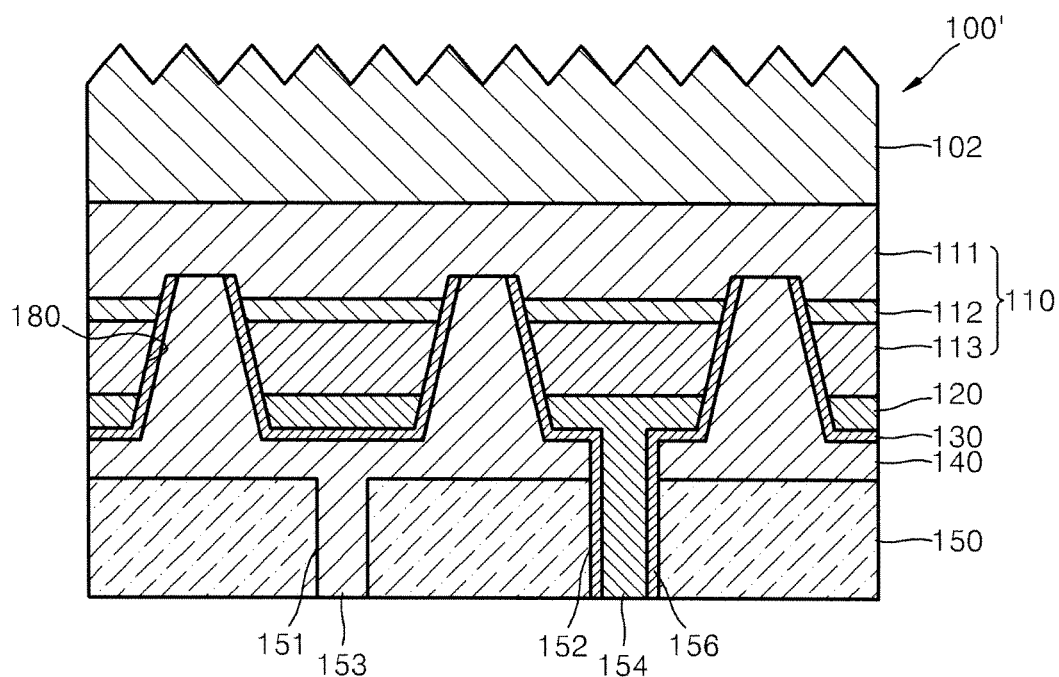
FIG. 1B is a cross-sectional view illustrating a modified example of the semiconductor light-emitting device of FIG. 1.
Figure 2:
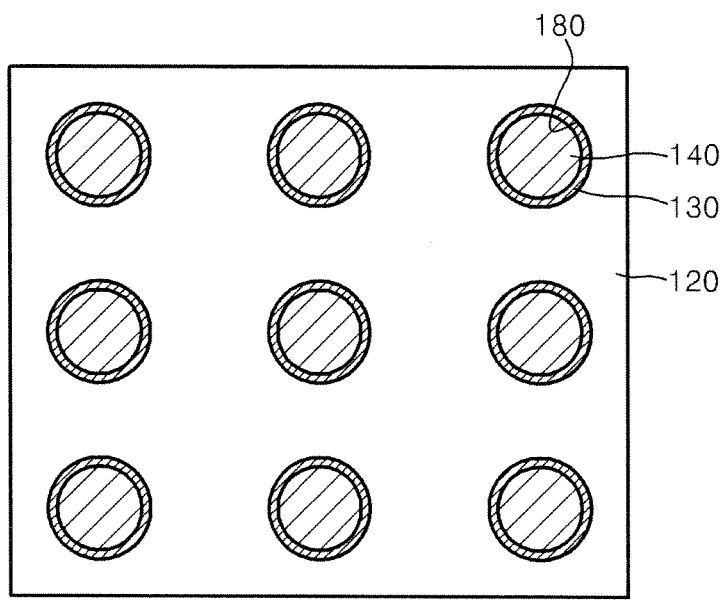
FIG. 2 is a cross-sectional view taken along line II-II' of FIG. 1A.

FIG. 1A is a cross-sectional view illustrating a semiconductor light-emitting device 100 according to an embodiment of the present invention. FIG. 1B is a modified example of the semiconductor light-emitting device 100 of FIG. 1A. FIG. 2 is a cross-sectional view taken along line II-II' of FIG. 1A.

Referring to FIGS. 1A and 2, the semiconductor light-emitting device 100 includes a semiconductor structure 110, an electrode structure disposed on one surface of the semiconductor structure 110, and a substrate supporting the electrode structure.

The semiconductor structure 110 includes a substrate (not shown), and a first semiconductor layer 111, an active layer 112, and a second semiconductor layer 113 sequentially formed by using crystal growth on a substrate (not shown), for example, a sapphire substrate. The sapphire substrate may be removed during a manufacturing process and is not shown in FIG. 1A for convenience.

The semiconductor structure 110 is formed of III-V semiconductors such as gallium nitride (GaN), indium nitride (InN), and aluminum nitride (AlN). Since the sapphire substrate has a lattice structure similar to that of each of the nitride semiconductors, the sapphire substrate is used for crystal growth. The first semiconductor layer 111 may have n-type conductivity and the second semiconductor layer 113 may have p-type conductivity. Alternatively, the first semiconductor layer 111 may have p-type conductivity and the second semiconductor layer 113 may have n-type conductivity.

The active layer 112 is located between the first semiconductor layer 111 and the second semiconductor layer 113. The active layer 112 may have, for example, a multi-quantum well structure. The multi-quantum well structure includes a plurality of quantum well layers and a plurality of quantum barrier layers formed between the quantum well layers. In detail, if the semiconductor structure 110 is a gallium nitride-based light-emitting diode, the first semiconductor layer 111 may be formed of GaN doped with n-type impurities, the second semiconductor layer 113 may be formed of GaN doped with p-type impurities, and the active layer 112 may be formed by alternately stacking multi-well layers formed of InGaN and quantum barrier layers formed of GaN. Electrons and holes injected through the first semiconductor layer 111 and the second semiconductor layer 113 combine with each other in the active layer 112 to emit light L. The emitted light L is emitted through the first semiconductor layer 111 of the semiconductor structure 110.

A second electrode layer 120, an insulating layer 130, a first electrode layer 140, and a non-conductive substrate 150 are sequentially disposed under the second semiconductor layer 113. A portion of the first electrode layer 140 passes through the insulating layer 130, the second electrode layer 120, the second semiconductor layer 113, and the active layer 112, and extends through a contact hole 180 that reaches a predetermined region of the first semiconductor layer 111 to contact the first semiconductor layer 111. A plurality of the contact holes 180 may be formed as shown in FIG. 2. The first electrode layer 140 filled in the plurality of contact holes 180 may rapidly diffuse and supply current to the first semiconductor layer 111.

Figure 10A:
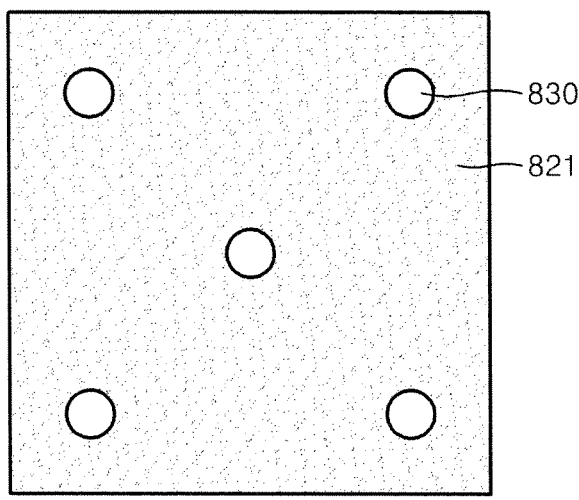
FIGS. 10A through 10D are plan views illustrating electrode patterns in a process of manufacturing a semiconductor light-emitting device, according to an embodiment of the present invention.

The contact holes 180 may be arranged in a matrix in consideration of current spreading and light extraction. The contact holes 180 may be arranged at regular intervals in at least one direction from among a horizontal direction and a vertical direction as shown in FIG. 2 or FIG. 10A. If necessary, the contact holes 180 may be arranged randomly at different intervals.

A size of each of the contact holes 180 may range from 0.1 to 500 μm, and preferably, may range from 5 to 300 μm. In the present embodiment, the contact hole 180 has a size ranging from 30 to 100 μm.

An area of a portion of the contact hole 180 contacting the first semiconductor layer 111 may range from 0.01 to 30% of an area of the first semiconductor layer 111 including the contact hole 180, preferably, may range from 0.9 to 10.4%, and more preferably, may be about 2.6%. If an area of the contact hole 180 is less than 0.01%, since an operating voltage is increased, light efficiency may be reduced and power consumption may be increased. On the other hand, if an area of the contact hole 180 is greater than 30%, an effective light-emitting area is relatively reduced. In the present embodiment, a regular square chip having lengths of 1100 μm in horizontal and vertical directions is used, and light efficiencies of three light-emitting devices including the contact holes 180 that contact the first semiconductor layer 111 and have areas of 11300 μm$^2$ (0.9% of an area of the regular square chip), 31400 μm$^2$ (2.6% of an area of the regular square chip), and 126000 μm$^2$ (10.4% of an area of the regular square chip) are compared. The light efficiency of the light-emitting device including the contact hole 180 whose area is 31400 μm$^2$ (2.6% of an area of the regular square chip) is the highest and the light efficiencies of the other two light-emitting devices are lower than the highest light efficiency by about 10%.

A inclination angle 'α' between a bottom plane of the contact hole 180, which is parallel to the first semiconductor layer 111, and a side surface of the contact hole 180 is greater than 0 degrees and is less than 90 degrees, and preferably may be about 30 to 60 degrees. If the inclination angle 'α' is equal to or greater than 90 degrees, it may be difficult to form the insulating layer 130 along the inclined side surface of the contact hole 180, and it may be difficult to form the first electrode layer 140. The inclined side surface of the contact hole 180 may be stepped in order to improve light extraction efficiency, and a concavo-convex structure may be formed on the inclined side surface of the contact hole 180. A reflective material may be partially or entirely coated on the inclined side surface. The reflective material may include at least one selected from the group consisting of silver (Ag), aluminum (Al), platinum (Pt), nickel (Ni), palladium (Pd), titanium (Ti), gold (Au), iridium (Ir), tungsten (W), stannum (Sn), an oxide thereof, and a mixture thereof, and may have a single-layer structure or a multi-layer structure. The reflective material improves light extraction efficiency.

The insulating layer 130 for electrically insulating the first electrode layer 140 from layers other than the first semiconductor layer 111 is formed between the first electrode layer 140 and the second electrode layer 120. The insulating layer 130 is formed not only between the first electrode layer 140 and the second electrode layer 120 but also between the first electrode layer 140 and side surfaces of the second electrode layer 120, the second semiconductor layer 113, and the active layer 112 exposed by the contact hole 180. Also, the insulating layer 130 may be formed on a side surface of the predetermined region of the first semiconductor layer 111 which the contact hole 180 reaches.

The second electrode layer 120 is formed to contact the second semiconductor layer 113. Since the second electrode layer 120 electrically contacts the second semiconductor layer 113, the second electrode layer 120 is formed of a reflective material that may minimize contact resistance to the second semiconductor layer 113 and improve luminous efficiency by reflecting light generated by the active layer 112 to the outside. The second electrode layer 120 may be formed of at least one material selected from the group consisting of Ag, Al, Pt, Ni, Pd, Ti, Au, Ir, W, Sn, an oxide thereof, and a mixture thereof, and has a single-layer structure or a multi-layer structure. A thickness of each layer may range from 0.1 to 5000 nm, and preferably, may range from 2 to 2000 nm. In the present embodiment, the second electrode layer 120 has a 4-layer structure including Ag, Ni, Ti, and TiN layers, and thicknesses of the Ag, Ni, Ti, and TiN layers are respectively 150 nm, 50 nm, 50 nm, and 400 nm. If a thickness of the Ag layer of the second electrode layer 120 is less than 40 nm, a reflectivity may be reduced and light output may be reduced. If a thickness of the Ag layer of the second electrode layer 120 is greater than 150 nm, material costs may be increased and a processing time may be increased. Accordingly, it is preferable that a thickness of the Ag layer of the second electrode layer 120 ranges from 100 to 150 nm. After the second electrode layer 120 is formed, heat treatment is performed to form an ohmic contact. Good ohmic characteristics are obtained by performing rapid thermal annealing (RTA) as heat treatment at 350° C. for 60 seconds in the present embodiment. While a temperature and a time of heat treatment may vary according to a material of an ohmic electrode, the heat treatment may be performed at 300 to 800° C. for 5 to 5000 seconds, and preferably, may be performed at 300 to 600° C. for 30 to 180 seconds.

A first through-hole 151 filled with a first contact 153 that supplies current to the first electrode layer 140, and a second through-hole 152 filled with a second contact 154 that supplies current to the second electrode layer 120 are formed in the non-conductive substrate 150. The second through-hole 152 extends to pass through the first electrode layer 140. An insulating layer 156 is further formed on an inner circumferential surface of the second through-hole 152 to electrically insulate the second contact 154 from the first electrode layer 140. The first contact 153 is electrically connected to the first electrode layer 140 passing through the non-conductive substrate 150. The second contact 154 is electrically connected to the second electrode layer 120 passing through the non-conductive substrate 150, the first electrode layer 140 and the insulating layer 130.

The non-conductive substrate 150 may include any one material selected from the group consisting of a nitride-based material such as GaN, AlN, aluminum gallium nitride (AlGaN), or indium gallium nitride (InGaN), an aluminum oxide-based material such as sapphire or alumina, diamond, a silicon-based material such as silicon (Si), a gallium (Ga) oxide-based material such as Ga2O3 or LiGaO2, a zinc (Zn) oxide-based material such as zinc oxide (ZnO), ceramic, and polymer.

Although the first contact 153 and the second contact 154 are formed in the non-conductive substrate 150, the present embodiment is not limited thereto. For example, a through-hole may be formed in a conductive substrate (see FIG. 4B), an insulating layer 460 (see FIG. 4B) may be formed on an inner circumferential surface of the through-hole and a surface of the conductive substrate, and a first contact 453 (see FIG. 4B) and a second contact 454 (see FIG. 4B) may be filled with metals, which will be explained in detail with reference to FIGS. 4A through 4C. The conductive substrate may be formed of a Si-based material, a germanium (Ge)-based material, a Si material containing aluminum, or a nitride-based material such as GaN.

As described above, according to the present embodiment, since an electrode connected to a first semiconductor layer and a second semiconductor layer is formed on a lower surface of a light-emitting device, a light-emitting area is prevented from being reduced, thereby maximizing luminous efficiency. Also, since the electrode is formed on a lower surface of a non-conductive substrate, direct package die bonding may be performed without wire bonding.

FIG. 1B is a cross-sectional view illustrating a light-emitting device 100' that is a modified example of the light-emitting device 100 of FIG. 1A. The same elements as those in FIG. 1A are denoted by the same reference numerals, and thus a detailed explanation thereof will not be given.

Referring to FIG. 1B, a sapphire substrate 102 is disposed on the first semiconductor layer 111 of the semiconductor structure 110. The sapphire substrate 102 is a substrate on which the semiconductor structure 110 is grown. A concavo-convex structure may be formed on a surface of the sapphire substrate 102. The concavo-convex structure may improve light extraction efficiency of the light-emitting device 100'. Other elements of the light-emitting device 100' are substantially the same as those of the light-emitting device 100, and thus a detailed explanation thereof will not be given.

FIGS. 3A through 3J are cross-sectional views for explaining a method of manufacturing a semiconductor light-emitting device, according to an embodiment of the present invention. Although a method of manufacturing one light-emitting device is illustrated in FIGS. 3A through 3J for convenience of explanation, a plurality of light-emitting devices may be integrally formed on a wafer and may be cut into individual light-emitting devices, or a light-emitting device unit integrally including a plurality of light-emitting devices may be manufactured.

Figure 3A:
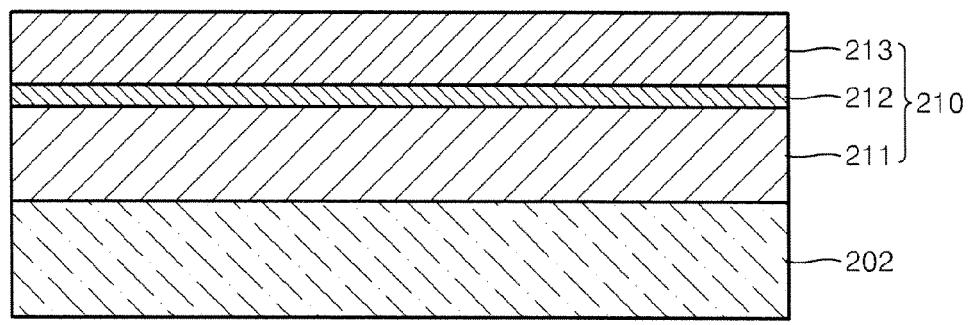
FIGS. 3A through 3J are cross-sectional views for explaining a method of manufacturing a semiconductor light-emitting device, according to an embodiment of the present invention.

Referring to FIG. 3A, a semiconductor structure 210 is formed by sequentially forming a first semiconductor layer 211, an active layer 212, and a second semiconductor layer 213 by using crystal growth on a top surface of a substrate 202.

A substrate suitable for a semiconductor to be formed by using crystal growth may be selected as the substrate 202. For example, if a nitride semiconductor single crystal is to be grown, the substrate 202 may be any one selected from the group consisting of a sapphire substrate, a ZnO substrate, a GaN substrate, a silicon carbide (SiC) substrate, and an AlN substrate.

The substrate 202 may have a thickness of about 300 to 1200 μm according to a size. Various patterns may be formed on a surface or a rear surface of the substrate 202 according to a type of a material (e.g., a thermal expansion coefficient) to be grown on the top surface of the substrate 202. The patterns may reduce crystal defects during crystal growth, and reduce stress due to thermal expansion or the like. The patterns may improve light extraction efficiency. The patterns may have circular or polygonal shapes (e.g., triangular shapes, square shapes, pentagonal shapes, or octagonal shapes) when viewed along a plane. The patterns may have semi-circular, circular conic, or polygonal cross-sectional shapes (e.g., triangular shapes, square shapes including trapezoidal shapes, pentagonal shapes, or hexagonal shapes). After crystal growth, the substrate 202 may be partially or entirely removed by a laser beam, chemical etching, or the like. A thickness of the substrate 202 may range from about 50 to 300 μm that is small, and a concavo-convex structure may be formed on a surface of the substrate 202.

Although not shown in FIG. 3A, a buffer layer (not shown) may be further formed between the substrate 202 and the first semiconductor layer 211. The buffer layer is a layer for improving lattice matching between the substrate 202 and the first semiconductor layer 211. If a nitride semiconductor single crystal is to be grown, the buffer layer may be formed of a material including any one selected from the group consisting of SiC, a nitride such as GaN, AlGaN, InGaN, InN, or AlInGaN, a Zn oxide, a Si oxide, and a combination thereof.

The buffer layer may be formed to a thickness of 2 to 800 nm at 400 to 800° C. to have a single-layer structure or a multi-layer structure. The buffer layer may be formed of an amorphous material, a multi-crystalline material, or a mixture thereof. A single crystalline semiconductor layer is formed on a top surface of the buffer layer. For example, an amorphous or a multi-crystalline GaN buffer layer is formed at 500 to 600° C. and then a single crystalline GaN layer is formed at 1000 to 1200° C. In this process, at least one part of the amorphous or multi-crystalline GaN buffer layer is single-crystallized. The semiconductor structure 210 may be formed by growing III-V semiconductors such as GaN, InN, and AlN. For example, if the semiconductor structure 210 is a gallium nitride-based light-emitting diode, the first semiconductor layer 211, the active layer 212, and the second semiconductor layer 213 may be formed of a semiconductor material having a formula represented by $Al_xIn_yGa_{(1-x-y)}N$ (where $0 \leq x \leq 1$, $0 \leq y \leq 1$, and $0 \leq x+y \leq 1$), and may be formed by using epitaxial growth using metal organic chemical vapor deposition (MOCVD) equipment. That is, the first semiconductor layer 211 may be a nitride semiconductor layer (formed of GaN, InN, InGaN, AlGaN, AlN, AlInGaN, or a combination thereof) doped, non-doped, or combined with first conductive impurities such as Si, Ge, or Sn. The active layer 212 may be a InGaN/GaN layer, a InGaN/InGaN layer, a AlGaN/GaN layer, a AlGaN/AlGaN layer, a AlInGaN/AlInGaN layer or a combination thereof having a multi-quantum well structure, one quantum well layer structure, or a double hetero structure. The second semiconductor layer 213 may be s a nitride semiconductor layer (formed of GaN, InN, InGaN, AlGaN, AlN, AlInGaN, or a combination thereof) doped with, non-doped with, or combined with second conductive impurities such as magnesium (Mg), zinc (Zn), or beryllium (Be). The first semiconductor layer 211, the active layer 212, and the second semiconductor layer 213 may have various thicknesses (ranging from 1 to 10000 nm) or impurity concentrations (ranging from $1 \times 10^{15}/cm^3$ to $1 \times 10^{22}/cm^3$) according to functions of the first semiconductor layer 211, the active layer 212, and the second semiconductor layer 213.

Figure 3B:
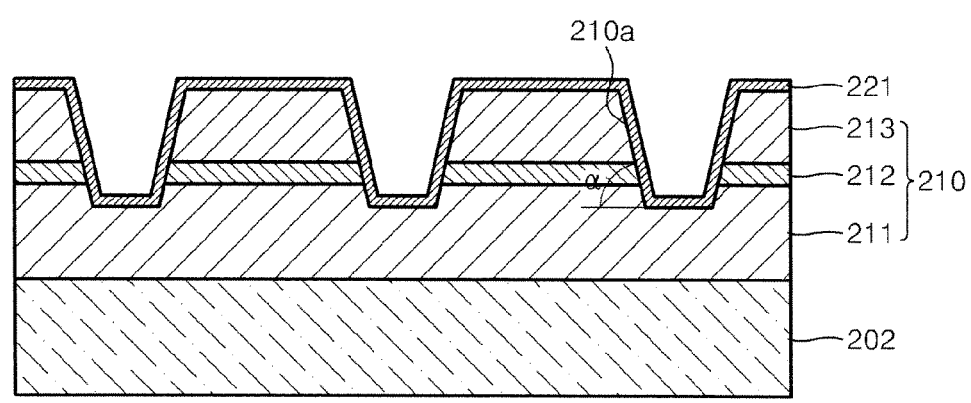

Referring to FIG. 3B, a contact hole 210a is formed by using etching to a predetermined depth (from 0.5 to 20 μm) of the first semiconductor layer 211 from the second semiconductor layer 213 by using dry etching (e.g., inductively-coupled plasma reactive ion etching (ICP-RIE)) and/or wet etching. The contact hole 210a is formed by removing the second semiconductor layer 213 and the active layer 212 to expose at least a surface of the first semiconductor layer 211. A portion of the first semiconductor layer 211 may be etched to a predetermined depth (0.1 nm to 5000 nm), and if necessary, a through-hole may be formed. A size (diameter) of the contact hole 210a may range from 0.1 to 500 μm, and preferably, may range from 5 to 300 μm. A plurality of the contact holes 210a may be formed. An area of a portion of the contact hole 210a contacting the first semiconductor layer 211 may range from 0.01 to 30% of an area of the first semiconductor layer 211 including the contact hole 210a, preferably may range from 0.9% to 10.4%, and more preferably, may be about 2.6%. An inclination angle 'α' between a bottom plane of the contact hole 210a, which is parallel to the first semiconductor layer 211, and a side surface of the contact hole 210a may be greater than 0 degrees and less than 90 degrees, and preferably, may range from about 30 to 60 degrees. If the inclination angle 'α' is greater than 90 degrees, it may be difficult to form an insulating layer 221 and it may be difficult to form a first electrode layer that will be described later. The inclined side surface of the contact hole 210a may be stepped in order to improve light extraction efficiency, and a concavo-convex structure may be formed on the inclined side surface. Also, a reflective material may be partially or entirely coated on the inclined side surface. The reflective material may include at least one selected from the group consisting of Ag, Al, Pt, Ni, Pd, Ti, Au, Ir, W, Sn, an oxide thereof, and a mixture there, and may have a single-layer structure or a multi-layer structure. The reflective material improves light extraction efficiency.

Figure 3C:
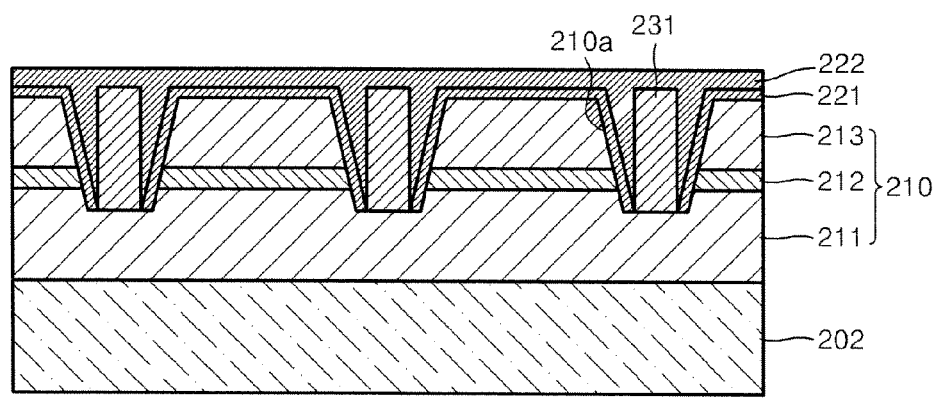

The insulating layer 221 is coated by using deposition on an entire top surface of the semiconductor structure 210 including the contact hole 210a. For example, the insulating layer 221 may be formed by depositing $SiO_2$ or $SiN_x$ by using plasma enhanced chemical vapor deposition (PECVD). The insulating layer 221 may be formed to a thickness of 0.001 to 50 μm, and preferably, to a thickness of 0.3 to 1.2 μm. Referring to FIG. 3C, a portion of the first semiconductor layer 211 is exposed by etching a portion of the insulating layer 221 formed on a bottom of the contact hole 210a. The etching may be performed by using RIE dry etching or wet etching using a buffered oxide etchant (BOE).

A contact layer 231 is formed on the exposed portion of the first semiconductor layer 211. The contact layer 231 is formed of a material that may form an ohmic contact with the first semiconductor layer 211 and have a high reflectivity. For example, the contact layer 231 may be formed of a material including at least one selected from the group consisting Al, Ti, Pt, Ag, Ni, TiN, Au, Sn, and a mixture thereof and may have a single-layer structure or a multi-layer structure. A thickness of each layer may range from 0.1 to 5000 nm. For example, in the present embodiment, the contact layer 231 is formed by depositing a Al/Ti/Pt/Ti layer to a thickness of 200 nm/300 nm/100 nm/2 nm. In this case, current spreading to the first semiconductor layer 211 may be improved by forming a plurality of the first electrode layers 231 as shown in FIG. 2 or FIG. 10A. The plurality of contact layers 231 may be arranged in a matrix. After the contact layer 231 is formed, heat treatment for forming an ohmic contact is performed. Good ohmic characteristics are obtained by performing RTA as heat treatment at 550° C. for 60 seconds. While a temperature and a time of heat treatment may vary according to a material of an ohmic electrode, the heat treatment may be performed at 300 to 800° C. for about 5 to 5000 seconds, and preferably, may be performed at 300 to 600° C. for 30 to 180 seconds.

An insulating layer 222 is formed on the second semiconductor layer 213 to be filled between the insulating layer 221 and the contact layer 231 in the contact hole 210a. The insulating layer 222 may be formed of the same material as that of the insulating layer 221.

Figure 3D:
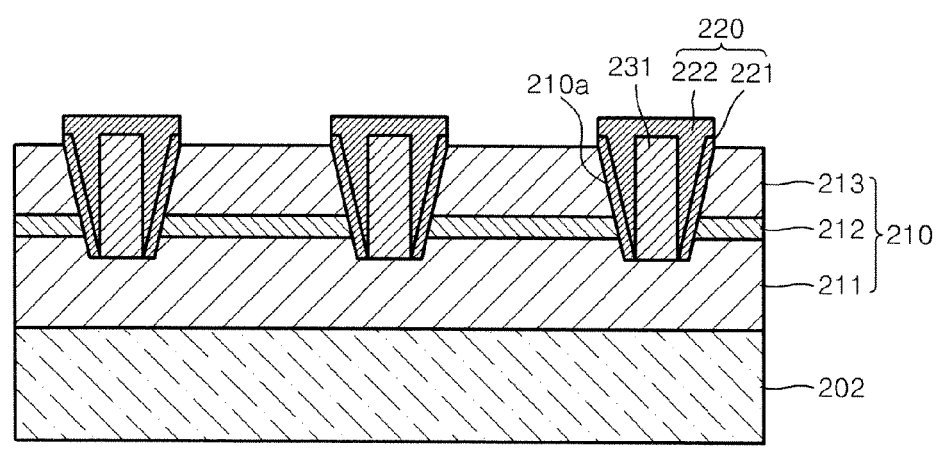

Referring to FIG. 3D, the second semiconductor layer 213 is exposed by etching a portion of the insulating layers 221 and 222 other than a portion that surrounds the contact hole 210a. The etching may be performed by performing RIE dry etching or wet etching using a BOE.

The insulating layer 221 and the insulating layer 222 may be collectively referred to as an insulating layer 220 herein below for convenience.

Figure 3E:
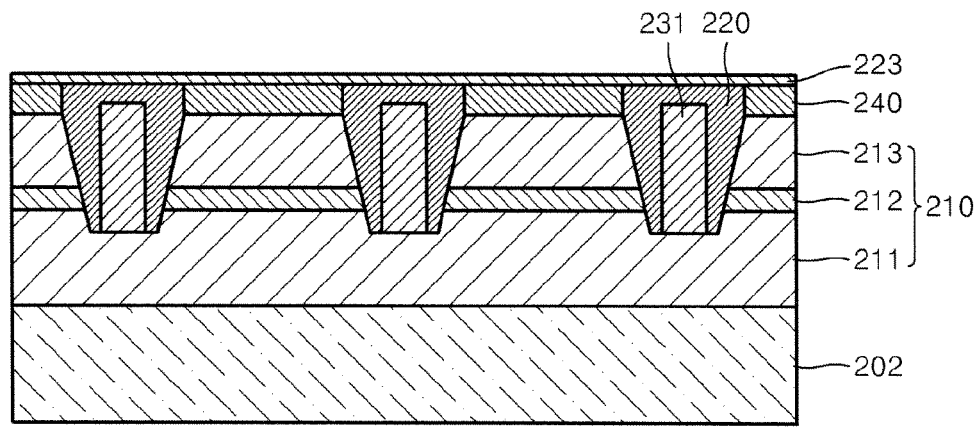

Referring to FIG. 3E, a second electrode layer 240 is formed on the exposed second semiconductor layer 213. The second electrode layer 240 may be formed of a metal that has both ohmic characteristics and light reflecting characteristics to act as a reflective layer, or may have a multi-layer structure formed by sequentially stacking metals having ohmic characteristics and light reflecting characteristics. The second electrode layer 240 may be formed of at least one material selected from the group consisting of Ag, Al, Pt, Ni, Pd, Ti, Au, Ir, W, Sn, an oxide thereof, and a mixture thereof, and may have a single-layer structure or a multi-layer structure. These materials improve light extraction efficiency.

Figure 3F:
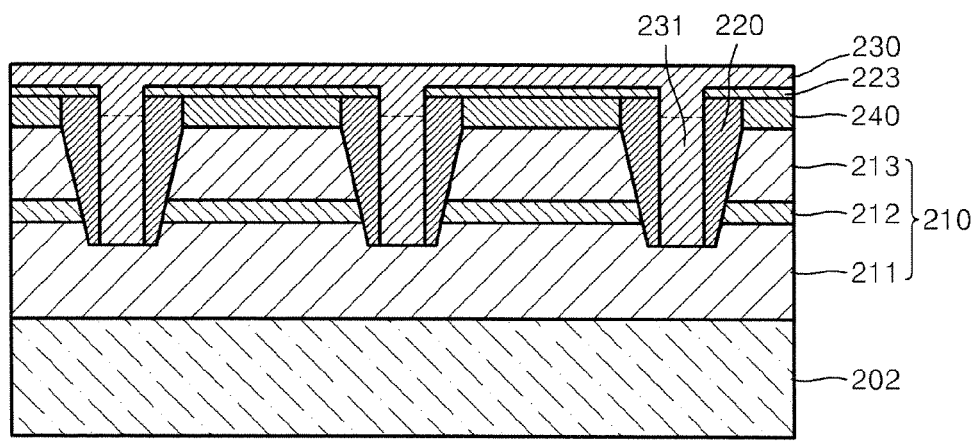

An insulating layer 223 is formed on the second electrode layer 240 to a predetermined thickness. The insulating layer 223 may be formed by depositing $SiO_2$ by using, for example, PECVD. Referring to FIG. 3F, the contact layer 231 is exposed by etching the insulating layer 220. A first electrode layer 230 connected to the exposed contact layer 231 is formed by coating a metal material on the insulating layer 220. The first electrode layer 230 is formed by repeatedly stacking a layer having a structure of Ti (100 nm)/Ni (100 nm) four times and additionally stacking a Ti (100 nm)/Au (1500 nm)/Sn (1400 nm)/Au (10 nm) layer.

Figure 3G:
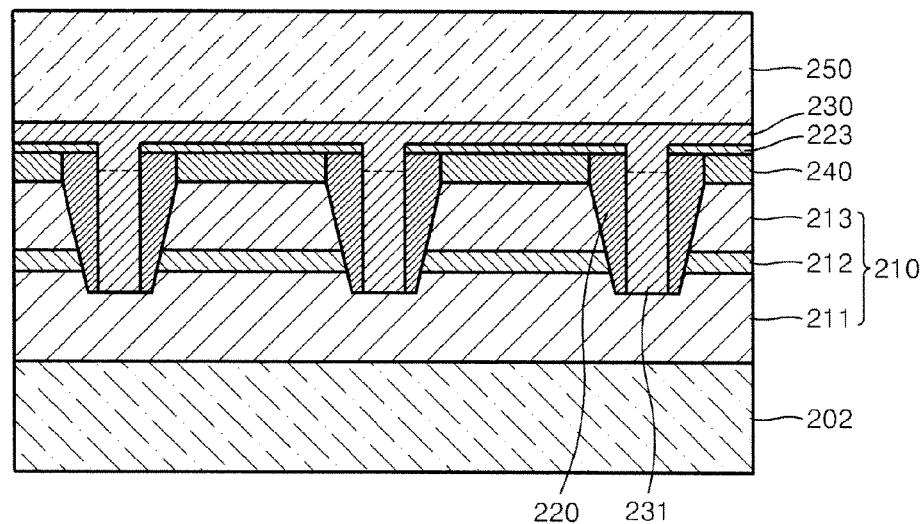

Referring to FIG. 3G, a non-conductive substrate 250 is bonded to the first electrode layer 230. The non-conductive substrate 250 may be an alumina substrate, an AlN substrate, a sapphire substrate, a ceramic substrate, or a polymer substrate. In order to adhere the non-conductive substrate 250 to the first electrode layer 230, a conductive adhesive material or a non-conductive adhesive material may be used as a medium between the non-conductive substrate 250 and the first electrode layer 230. The conductive adhesive material may include at least one selected from the group consisting of AuSn, Au, Cu, Pb, W, Ti, Pt, Sn, TiSn, and a mixture thereof and have a single-layer structure or a multi-layer structure. The non-conductive adhesive material may be silicon-on-glass (SOG), or polymer.

Figure 3H:
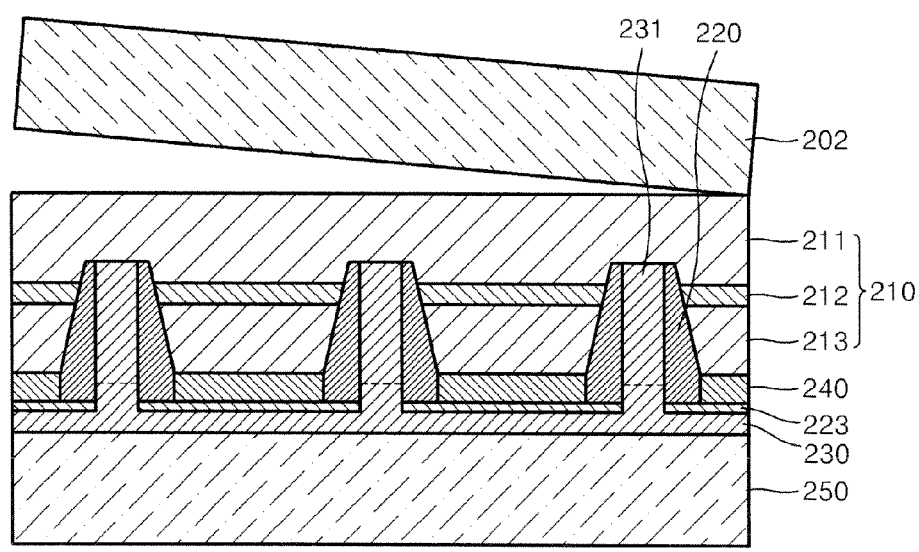

Referring to FIG. 3H, the substrate 202 is removed from the first semiconductor layer 211. For example, the substrate 202 may be separated from the first semiconductor layer 211 by irradiating laser light onto the substrate 202 to cause thermal reaction between the substrate 202 and the first semiconductor layer 211. The substrate 202 is removed by being lifted off from the first semiconductor layer 211. The substrate 202 may be removed by performing chemical etching or chemical-mechanical polishing.

Figure 3I:
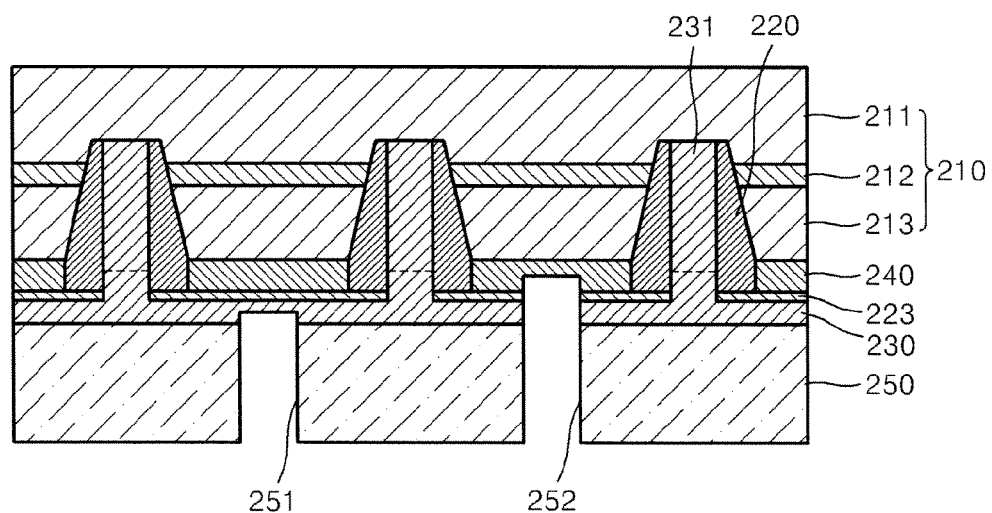

Referring to FIG. 3I, a first through-hole 251 and a second through-hole 252 respectively connected to the first electrode layer 230 and the second electrode layer 240 are formed from an exposed surface of the non-conductive substrate 250. A thickness of the substrate 250 may range from 50 to 300 μm, and preferably, may range from 100 to 200 μm. If a thickness of the substrate 250 is too great, it takes a long time to form the first and second through-holes 251 and 252, and if a thickness of the substrate 250 is too small, the substrate 250 may not sufficiently act as a support substrate.

Figure 3J:
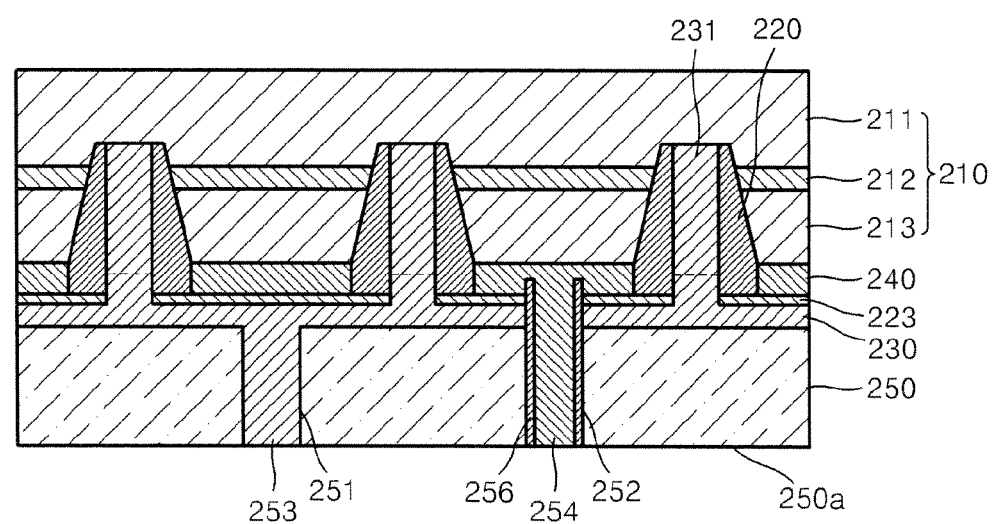

A size of each of the first and second through-holes 251 and 252 may range from 0.1 to 500 μm, and preferably, may range from 5 to 300 μm. One or more first and second through-holes 251 and 252 may be formed. An area of each of the first and second through-holes 251 and 252 may range from about 0.01 to 30% of an area of a bottom surface 250a of the substrate 250. The first and second through-holes 251 and 252 may be stepped or tapered with respect to the bottom surface 250a. Referring to FIG. 3J, an insulating layer 256 is formed on a side surface of the second through-hole 252. In this case, an insulating layer (not shown) may also be formed on a side surface of the first through-hole 251. A first contact 253 and a second contact 254 formed of metals are formed in the first through-hole 251 and the second through-hole 252, respectively. The first through-hole 251 and the second through-hole 252 may be formed by using laser drilling, dry etching, or wet etching.

Figure 4A:
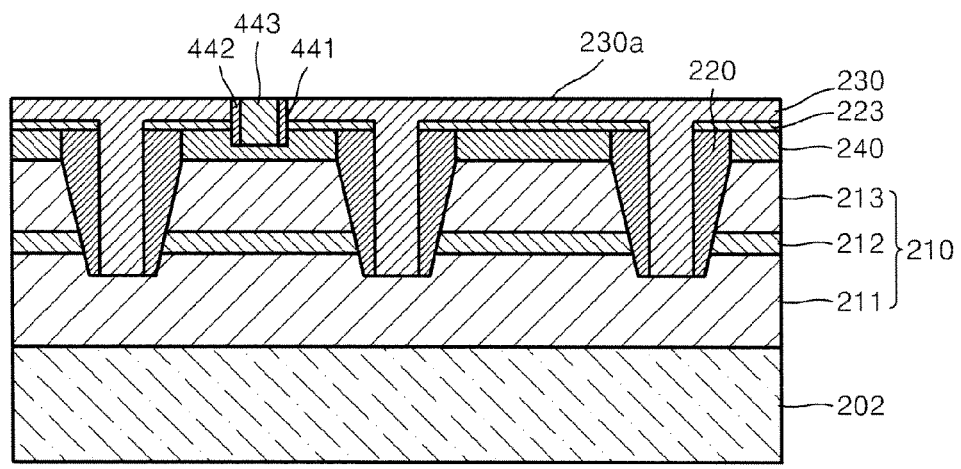
FIGS. 4A through 4C are cross-sectional views for explaining a method of manufacturing a semiconductor light-emitting device, according to another embodiment of the present invention.
Figure 4B:
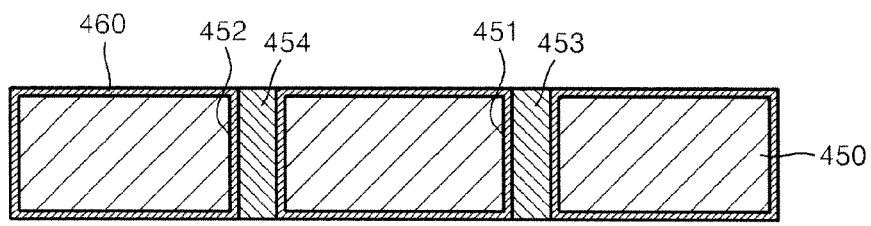
Figure 4C:
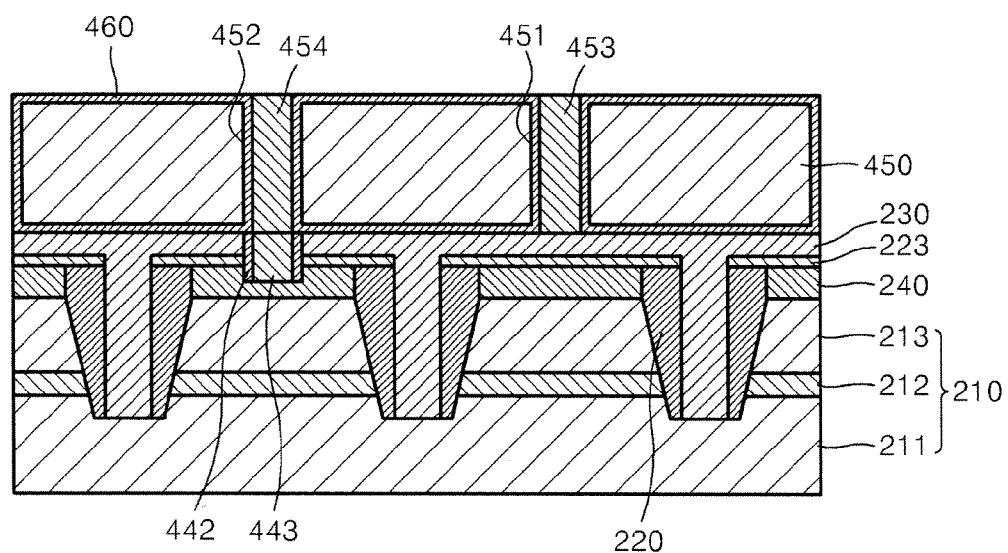

FIGS. 4A through 4C are cross-sectional views for explaining a method of manufacturing a semiconductor light-emitting device, according to another embodiment of the present invention.

The same processes as those of FIGS. 3A through 3F may be performed, and thus a detailed explanation thereof will not be given.

Referring to FIG. 4A, in a resultant structure formed by the processes of FIGS. 3A through 3F, a through-hole 441 connected to the second electrode layer 240 is formed from an exposed surface of the first electrode layer 230. An insulating layer 442 is formed on a side surface of the through-hole 441. A contact 443 formed of a metal is formed in the through-hole 441. The through-hole 441 may be formed by using laser drilling or dry etching. A thickness of the first electrode layer 230 may range from 0.1 to 300 μm, and preferably, may range from 0.5 to 100 μm. If a thickness of the first electrode layer 230 is greater than 300 μm, it may take a long time to form the through-hole 441 and costs may be increased. If a thickness of the first electrode layer 230 is less than 0.1 μm, the first electrode layer 230 may not sufficiently act as an adhesive layer. A size (diameter) of the through-hole 441 may range from 0.1 to 500 μm, and preferably, may range from 5 to 300 μm. In the present embodiment, the through-hole 441 has a size ranging from 30 to 100 µm. One or more through-holes 441 may be formed. An area of the through-hole 441 may range from 0.01 to 30% of an area of the first electrode layer 230. The through-hole 441 may be stepped or tapered with respect to a top surface 230a of the first electrode layer 230.

The insulating layer 442 may have a thickness ranging from 0.001 to 50 µm, and a thickness of the insulating layer 442 may preferably range from about 0.01 to 30% of a diameter of the through-hole 441. In the present embodiment, the insulating layer 442 has a thickness ranging from 0.01 to 0.9 µm.

Referring to FIG. 4B, a first through-hole 451 and a second through-hole 452 are formed in a conductive substrate 450. The second through-hole 452 is formed to correspond to the through-hole 441, and the first through-hole 451 is formed to be spaced apart from the second through-hole 452. The conductive substrate 450 may be formed of Si, Ge, or silicon containing a metal (for example, Al).

An insulating layer 460 is formed on a surface of the conductive substrate 450 including inner circumferential surfaces of the first through-hole 451 and the second through-hole 452.

A first contact 453 and a second contact 454 are formed by filling the first through-hole 451 and the second through-hole 452 with metals, respectively.

Referring to FIG. 4C, the conductive substrate 450 is bonded to the first electrode layer 230 such that the second contact 454 of the conductive substrate 450 contacts the contact 443. In order to adhere the conductive substrate 450 to the first electrode 230, a conductive adhesive material (not shown) may be formed on the first contact 453 and the second contact 454, and a non-conductive adhesive material (not shown) may be formed on other portions. The conductive adhesive material may include at least one selected from the group consisting AuSn, Au, Cu, Pb, W, Ti, Pt, Sn, TiSn, and a mixture thereof, and may have a single-layer structure or a multi-layer structure. The non-conductive adhesive material may be SOG or polymer.

The substrate 202 is removed from the first semiconductor layer 211. For example, the substrate 202 may be separated from the first semiconductor layer 211 by irradiating laser light onto the substrate 202 to cause thermal reaction between the substrate 202 and the first semiconductor layer 211. The substrate 202 is removed by being lifted off from the first semiconductor layer 211. Alternatively, the substrate 202 may be removed by performing chemical etching or chemical-mechanical polishing. The substrate 200 may be used without being removed by reducing a thickness of the substrate 202 or by forming a concavo-convex structure on a surface of the substrate 202.

Although the conductive substrate 450 is used in the method of FIGS. 4A through 4C, the non-conductive substrate 250 may be used in the method and a detailed explanation thereof will not be given.

Figure 5:
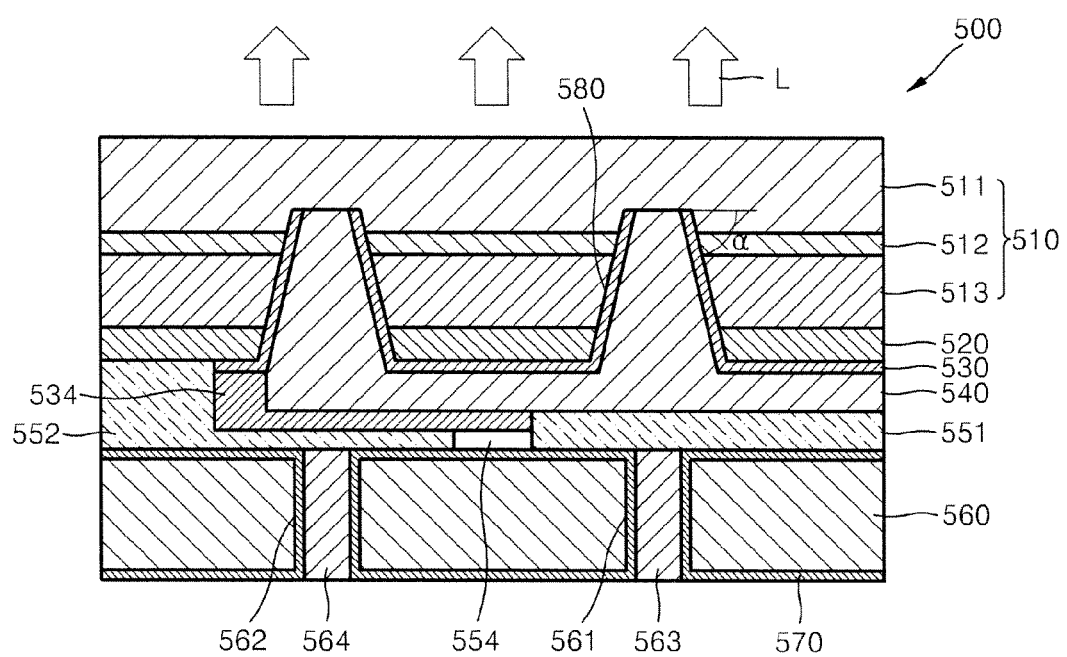
FIG. 5 is a cross-sectional view illustrating a semiconductor light-emitting device according to another embodiment of the present invention.

FIG. 5 is a cross-sectional view illustrating a semiconductor light-emitting device 500 according to another embodiment of the present invention.

Referring to FIG. 5, the semiconductor light-emitting device 500 includes a semiconductor structure 510, an electrode structure disposed on one surface of the semiconductor structure 510, and a substrate 560 supporting the electrode structure.

The semiconductor structure 510 includes a substrate (not shown), and a first semiconductor layer 511, an active layer 512, and a second semiconductor layer 513 sequentially formed by using crystal growth on the substrate, for example, a sapphire substrate. Since the sapphire substrate is removed in a manufacturing process, the sapphire substrate is not shown in FIG. 5.

The semiconductor structure 510 is formed of gallium nitride-based III-V semiconductors such as GaN, InN, InGaN, AlGaN, AlN, AlInGaN, and a combination thereof. Since the sapphire substrate has a lattice structure similar to that of each of the nitride semiconductors, the sapphire substrate is used for crystal growth. The first semiconductor layer 511 may have n-type conductivity and the second semiconductor layer 513 may have p-type conductivity. Alternatively, the first semiconductor layer 511 may have p-type conductivity and the second semiconductor layer 513 may have n-type conductivity.

The active layer 512 is located between the first semiconductor layer 511 and the second semiconductor layer 513. The active layer 512 may have, for example, a single or multi-quantum well structure. Electrons and holes injected through the first semiconductor layer 511 and the second semiconductor layer 513 combine with each other in the active layer 512 to emit light L. The emitted light L is emitted through the first semiconductor layer 511 of the semiconductor structure 510.

A second electrode layer 520, an insulating layer 530, a first electrode layer 540, and the substrate 560 are sequentially disposed under the second semiconductor layer 513. A portion of the first electrode layer 540 passes through the insulating layer 530, the second electrode layer 520, the second semiconductor layer 513, and the active layer 512, and extends through a contact hole 580 that reaches a predetermined region of the first semiconductor layer 511 to contact the first semiconductor layer 511. A plurality of the contact holes 580 may be formed as shown in FIG. 2. The first electrode layer 540 filled in the plurality of contact holes 580 may rapidly diffuse and supply current to the first semiconductor layer 511.

The contact hole 580 is formed by removing the second semiconductor layer 513 and the active layer 512 to expose at least a surface of the first semiconductor layer 511. A portion of the first semiconductor layer 511 may be etched to a predetermined depth (0.1 to 5000 nm), and if necessary, a through-hole may be formed. A size (diameter) of the contact hole 580 may range from 0.1 to 500 µm, and preferably, may range from 5 to 300 µm. A plurality of the contact holes 580 may be formed. An area of a portion of the contact hole 580 contacting the first semiconductor layer 511 may range from 0.01 to 30% of an area of the first semiconductor layer 511 including the contact hole 580, preferably may range from 0.9 to 10.4%, and more preferably, may be about 2.6%. A concavo-convex structure may be formed on a bottom of the contact hole 580. An inclination angle 'α' between a bottom plane of the contact hole 580, which is parallel to the first semiconductor layer 511, and a side surface of the contact hole 580 may be greater than 0 degrees and less than 90 degrees, and preferably, may range from about 30 to 60 degrees. If the inclination angle 'α' is greater than 90 degrees, it may be difficult to form the insulating layer 530 on the inclined side surface and it may be difficult to form the first electrode layer 540. The inclined side surface of the contact hole 580 may be stepped in order to improve light extraction efficiency, and a concavo-convex structure may be formed on the inclined side surface. Also, a reflective material may be partially or entirely coated on the inclined side surface. The reflective material may include at least one selected from the group consisting of Ag, Al, Pt, Ni, Pd, Ti, Au, Ir, W, Sn, an oxide thereof, and a mixture there, and may have a single-layer structure or a multi-layer structure. The reflective material improves light extraction efficiency.

The insulating layer 530 for electrically insulating the first electrode layer 540 from layers other than the first semiconductor layer 511 is formed between the first electrode layer 540 and the second electrode layer 520. The insulating layer 530 is formed not only between the first electrode layer 540 and the second electrode layer 520 but also between the first electrode layer 540 and side surfaces of the second electrode layer 520, the second semiconductor layer 513, and the active layer 512 exposed by the contact hole 580. Also, the insulating layer 530 may also be formed on a side surface of the predetermined region of the first semiconductor layer 511 which the contact hole 580 reaches. The insulating layer 530 may have a thickness ranging from 0.001 to 50 μm, and a thickness of the insulating layer 53 may preferably range from about 0.001 to 30% of a diameter of the contact hole 580. In the present embodiment, the insulating layer 530 has a thickness ranging from 0.01 to 0.9 μm.

The second electrode layer 520 is formed to contact the second semiconductor layer 513. The second electrode layer 550 does not exist in predetermined regions through which the contact hole 580 passes. Since the second electrode layer 520 electrically contacts the second semiconductor layer 513, the second electrode layer 520 is formed of a material that may minimize contact resistance to the second semiconductor layer 513 and improve luminous efficiency by reflecting light generated by the active layer 512 to the outside. The second electrode layer 520 may be formed of at least one material selected from the group consisting of Ag, Al, Pt, Ni, Pd, Ti, Au, Ir, W, Sn, an oxide thereof, and a mixture thereof. A first electrode pad 551 is formed under a portion of the first electrode layer 540, and an insulating layer 534 is formed on the other portion of the first electrode layer 540. The insulating layer 534 contacts the insulating layer 530. A second electrode pad 552 is formed under a portion of the second electrode layer 520 where the insulating layer is not formed. The second electrode pad 552 is electrically connected to the second electrode layer 520. The second electrode pad 552 is spaced apart from the first electrode 551 by a gap 554 therebetween. The second electrode pad 552 may be spaced apart from the first electrode pad 551 and may be formed at the vertically same position as the first electrode pad 551. Areas covered by the second electrode pad 552 and the first electrode pad 551 may be designed according to needs.

Each of the first and second electrode pads 551 and 552 may be formed of a material including at least one selected from the group consisting of AuSn, Au, Al, Ni, Cu, Pb, W, Ti, Pt, Sn, TiSn, and a mixture thereof. Each of the first and second electrode pads 551 and 552 may have a single-layer structure or a multi-layer structure including a plurality of layers formed of different materials. A thickness of each of the first and second electrode pads 551 and 552 may range from 0.1 to 500 μm. It is preferable that the first electrode pad 551 has an area equal to or greater than that of the second electrode pad 552 in consideration of heat dissipation or the like.

The gap 554 may be filled with an insulating material (not shown).

The substrate 560 is attached to bottom surfaces of the first electrode pad 551 and the second electrode pad 552. A first through-hole 561 and a second through-hole 562 spaced apart from each other are formed in the substrate 560. A first contact 563 and a second contact 564 are respectively formed in the first through-hole 561 and the second through-hole 562. The first contact 563 and the second contact 564 are respectively connected to the first electrode pad 551 and the second electrode pad 552. If the substrate 560 is a conductive substrate, an insulating layer 570 is further formed such that the substrate 560 is insulated from the first and second contacts 563 and 564 and the first and second electrode pads 551 and 552.

Since a portion of the second electrode pad 552 contacting the second contact 564 is wide, the substrate 560 of the semiconductor light-emitting device 500 may be easily bonded to the second electrode pad 552. Also, a position and an area of each of the first and second electrode pads 551 and 552 may be easily changed in order to cause the electrode pad to contact the substrate 560 including a contact. An area of the second electrode pad 552 is equal to or greater than 1.2 times an area of the second contact 564 in order to facilitate contact between the second electrode pad 552 and the second contact 564. An area of the first electrode pad 551 may be equal to or greater than 1.2 times an area of the first contact 563 in order to facilitate contact between the first electrode pad 551 and the first contact 563.

FIGS. 6A through 6G are views for explaining a method of manufacturing a semiconductor light-emitting device, according to another embodiment of the present invention. The same processes as those of FIGS. 3A through 3E may be performed, and the same elements as those in FIGS. 3A through 3E are denoted by the same reference numerals and a detailed explanation thereof will not be given.

Figure 6A:
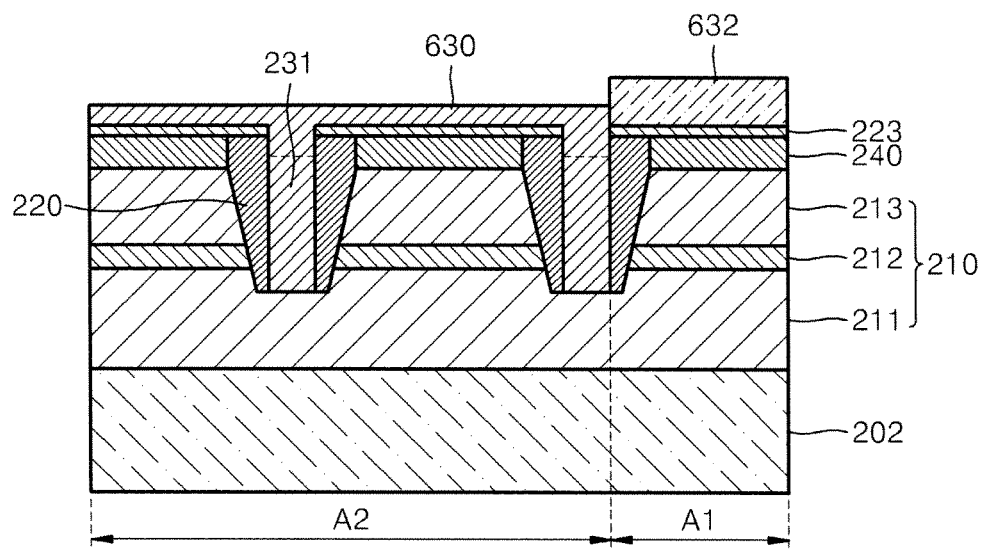
FIGS. 6A through 6G are views for explaining a method of manufacturing a semiconductor light-emitting device, according to another embodiment of the present invention.

In FIG. 6A, two contact layers 231 are illustrated for convenience. Referring to FIG. 6A, the contact layer 231 is exposed by etching the insulating layer 223. A photoresist 632 is formed in a first region A1 of the second electrode layer 240 on the insulating layer 223, and a first electrode layer 630 connected to the exposed contact layer 231 is formed by coating a metal material on a second region A2 exposed by the photoresist 632.

Figure 6B:
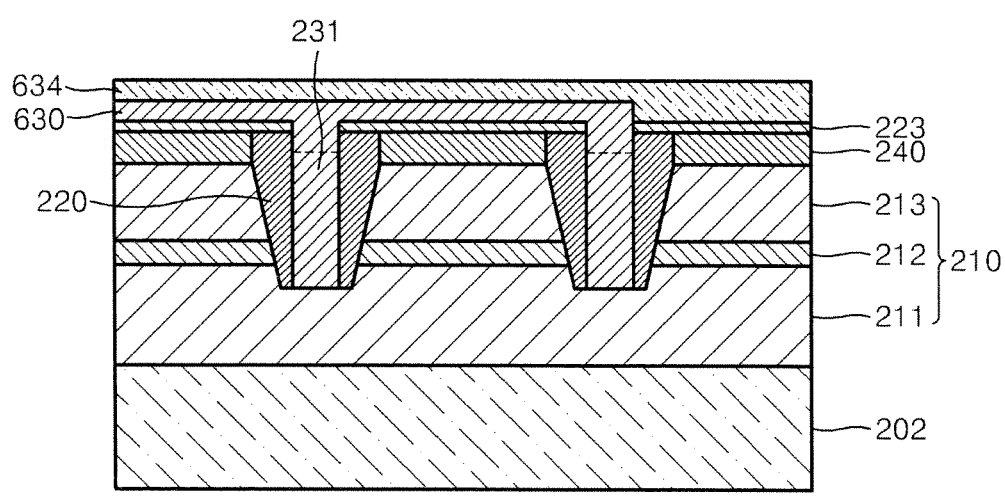

Referring to FIG. 6B, the photoresist 632 is removed, and an insulating layer 634 is formed on the insulating layer 223 to cover the first electrode layer 630.

Figure 6C:
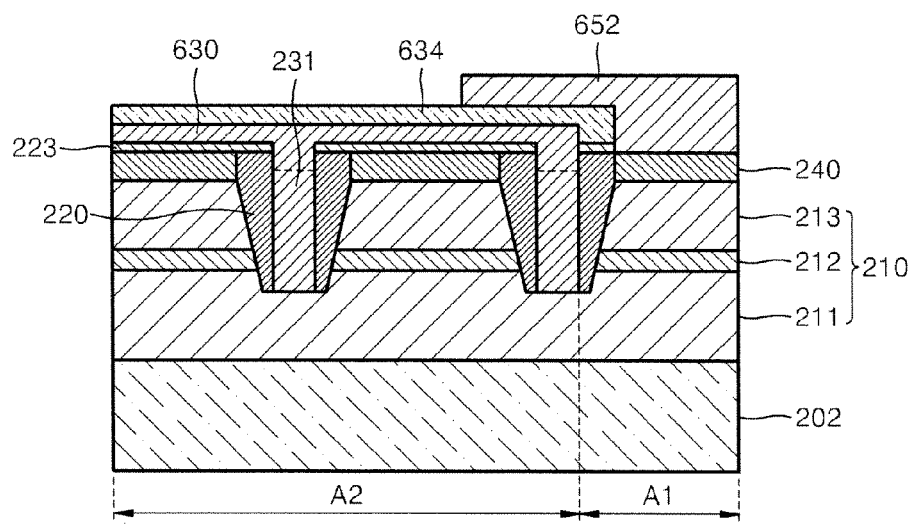

Referring to FIG. 6C, the second electrode layer 240 is exposed by patterning the insulating layers 634 and 223 in the first region A1, and then a second electrode pad 652 connected to the exposed second electrode layer 240 is formed. The second electrode pad 652 is formed to cover a portion of the insulating layer 634 in the second region A2, to increase a second electrode pad forming area.

Figure 6D:
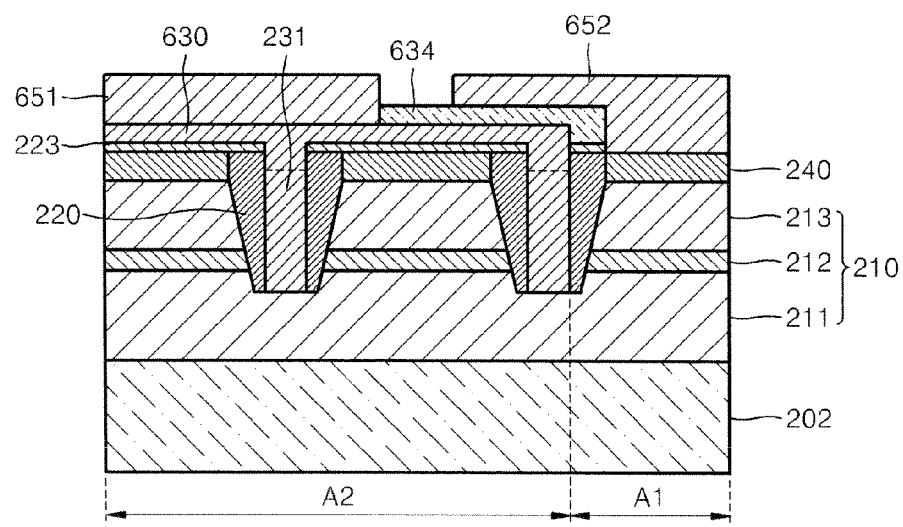

Referring to FIG. 6D, the first electrode layer 630 is exposed to be spaced apart from the second electrode pad 652 by etching a portion of the insulating layer 634 in the second region A2, and then a first electrode pad 651 is formed on the exposed first electrode layer 630. A surface of the first electrode pad 651 and a surface of the second electrode pad 652 may be on the same horizontal level.

Figure 6E:
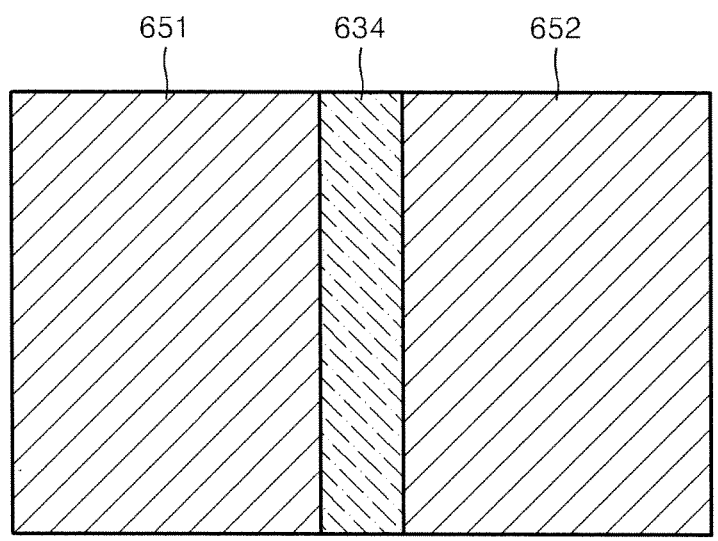

FIG. 6E is a plan view of a resultant structure of FIG. 6D. Referring to FIG. 6E, the first electrode pad 651 and the second electrode pad 652 are spaced apart from each other. The first electrode pad 651 and the second electrode pad 652 may be easily designed irrespective of areas of the first electrode layer 630 and the second electrode layer 240. Accordingly, electrical connection with an electrode formed on a previously prepared substrate may be facilitated.

Figure 6F:
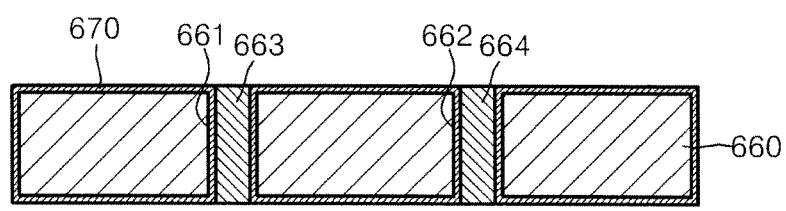

Referring to FIG. 6F, a first through-hole 661 and a second through-hole 662 are formed in a second substrate 660. The first through-hole 661 and the second through-hole 662 are formed to correspond to the first electrode pad 651 and the second electrode pad 652, respectively.

The second substrate 660 may be formed of a conductive material such as Si, Ge, or silicon containing a metal (for example, silicon containing Al). An insulating layer 670 is formed on a surface of the second substrate 660 including inner circumferential surfaces of the first through-hole 661 and the second through-hole 662.

If the second substrate 660 is a non-conductive substrate formed of a non-conductive material such as alumina, aluminum nitride, or sapphire, a process of forming the insulating layer 670 may be omitted.

A first contact 663 and a second contact 664 are formed by filling the first through-hole 661 and the second through-hole 662 with metals.

Figure 6G:
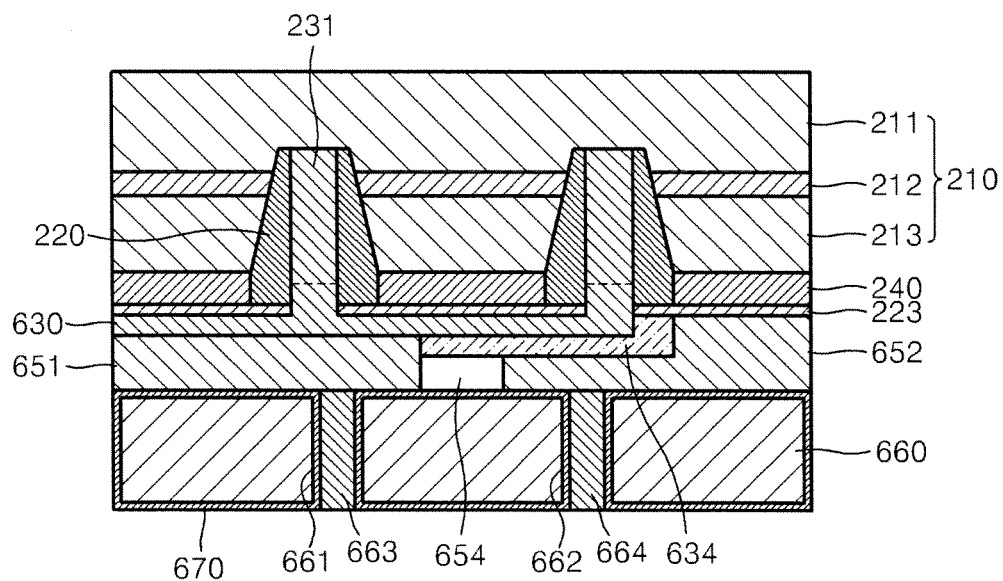

Referring to FIG. 6G, the first contact 663 and the second contact 664 of the second substrate 660 are bonded to the first electrode pad 651 and the second electrode pad 652 to contact the first electrode pad 651 and the second electrode pad 652, respectively. Next, the substrate 202 is removed from the first semiconductor layer 211.

Figure 7A:
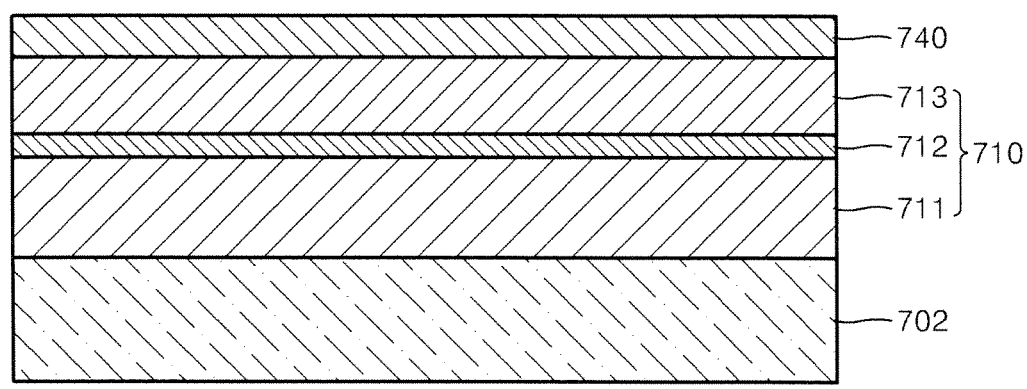
FIGS. 7A through 7C are cross-sectional views for explaining a method of manufacturing a semiconductor light-emitting device, according to another embodiment of the present invention.
Figure 7B:
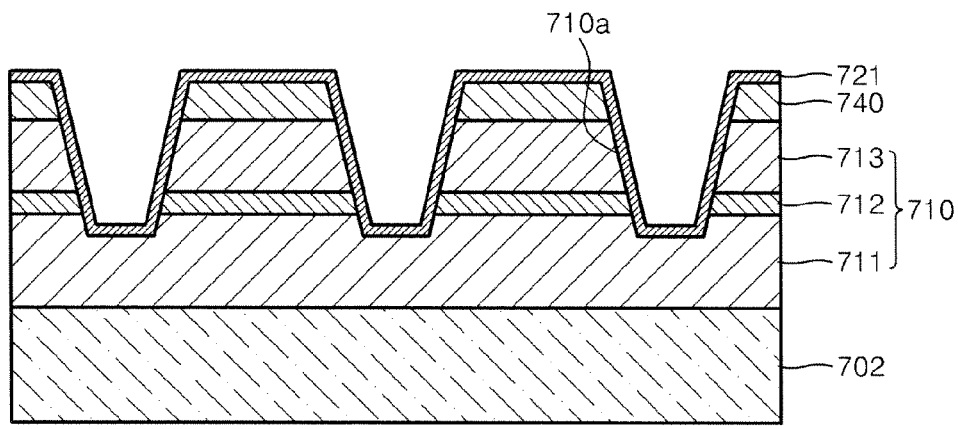
Figure 7C:
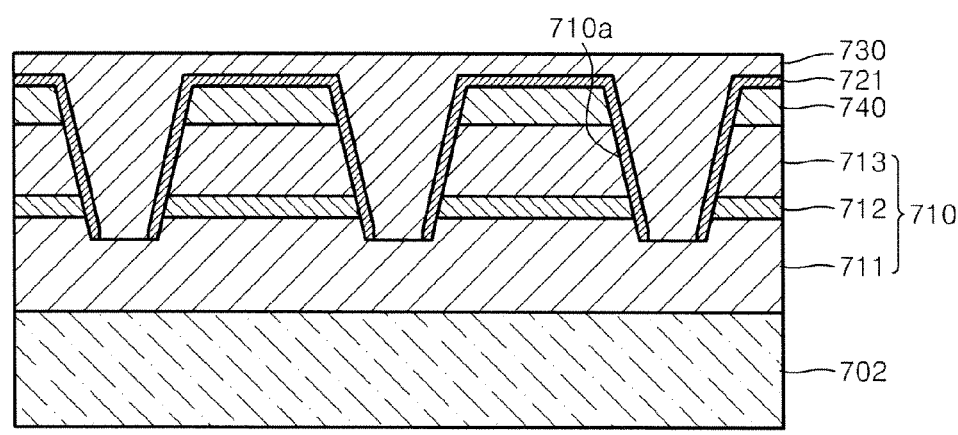

A gap 654 for separating the first electrode pad 651 from the second electrode pad 652 may be filled with an insulating layer (not shown). A material and a structure of a semiconductor layer, a material and a size of an electrode, and so on which are the same as those in the aforesaid embodiments will not be explained. FIGS. 7A through 7C are cross-sectional views for explaining a method of manufacturing a semiconductor light-emitting device, according to another embodiment of the present invention.

Referring to FIG. 7A, a semiconductor structure 710 is formed by sequentially forming a first semiconductor layer 711, an active layer 712, and a second semiconductor layer 713 by using crystal growth on a top surface of a substrate 702. A substrate suitable for a semiconductor to be formed by using crystal growth may be selected as the substrate 702. For example, if a nitride semiconductor single crystal is to be grown, the substrate 702 may be any one of a sapphire substrate, a ZnO substrate, a GaN substrate, a SiC substrate, and an AlN substrate.

Next, a second electrode layer 740 is formed on the second semiconductor layer 713.

Referring to FIG. 7B, a contact hole 710a is formed by using etching to a predetermined depth of the first semiconductor layer 711 from the second electrode layer 740 by using ICP-RIE. An insulating layer 721 is coated by using deposition on an entire top surface of the semiconductor structure 710 including the contact hole 710a. For example, the insulating layer 721 may be formed by depositing $SiO_2$ or $SiN_x$ by using PECVD. A detailed manufacturing process is the same as that described above.

Referring to FIG. 7C, a portion of the first semiconductor layer 711 is exposed by etching a portion of the insulating layer 721 formed on a bottom of the contact hole 710a. The etching may be performed by using RIE dry etching or wet etching using a BOE.

A first electrode layer 730 is formed on the insulating layer 721 to cover the exposed portion of the first semiconductor layer 711.

A step of forming another substrate on the first electrode layer 730 and removing the substrate 702, and a step of forming a first contact and a second contact connected to the first electrode layer 730 and the second electrode layer 740 on the another substrate may be inferred by referring to a manufacturing process using a non-conductive substrate (FIGS. 3G through 3J) or a manufacturing process using a conductive substrate (FIGS. 4A through 4C), and thus a detailed explanation thereof will not be given.

Also, a process of forming an electrode pad on the first electrode layer 730 and forming another substrate may be inferred by referring to FIGS. 6A through 6G, and thus a detailed explanation thereof will not be given.

Figure 8:
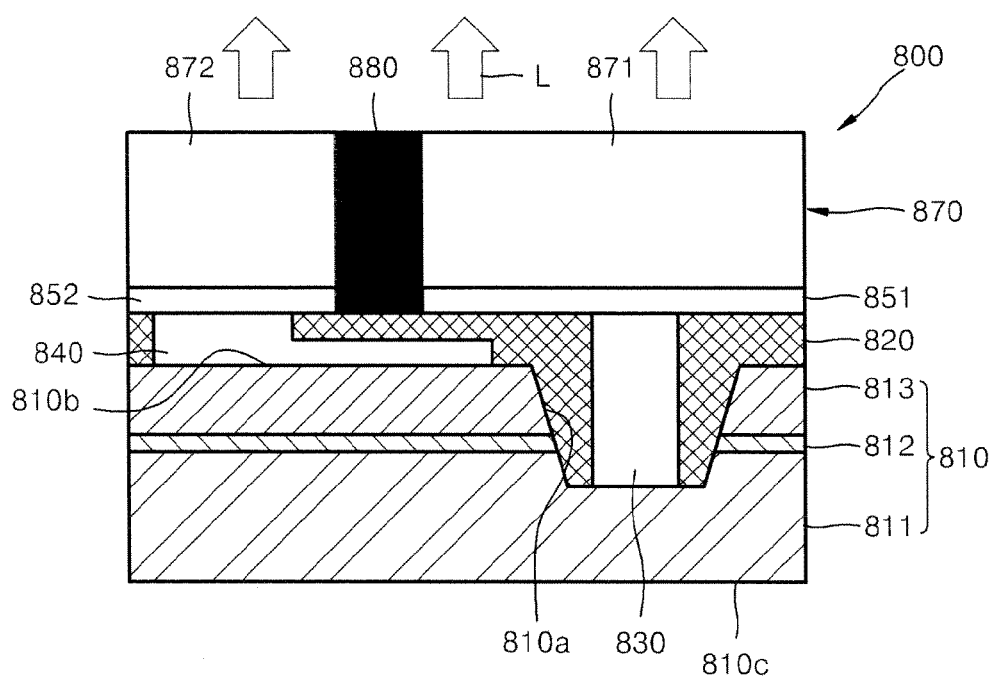
FIG. 8 is a cross-sectional view illustrating a semiconductor light-emitting device according to another embodiment of the present invention.

FIG. 8 is a cross-sectional view illustrating a semiconductor light-emitting device 800 according to another embodiment of the present invention.

Referring to FIG. 8, the semiconductor light-emitting device 800 includes a semiconductor structure 810, and an electrode structure disposed on one surface 810b of the semiconductor structure 810.

Figure 9A:
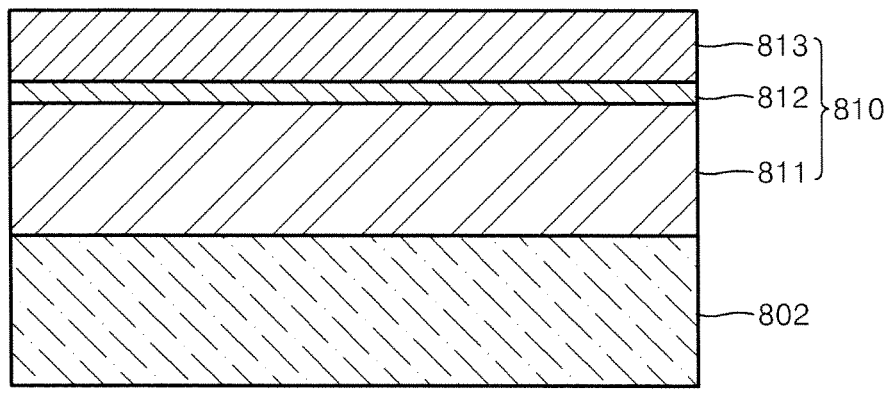
FIGS. 9A through 9L are cross-sectional views for explaining a method of manufacturing a semiconductor light-emitting device, according to another embodiment of the present invention.

The semiconductor structure 810 includes a first semiconductor layer 811, an active layer 812, and a second semiconductor layer 813 formed by using crystal growth on a predetermined substrate 802 (see FIG. 9A). The substrate 802 which is a base on which crystal growth occurs may be removed as will be described later.

Electrons and holes injected through the first semiconductor layer 811 and the second semiconductor layer 813 combine with each other in the active layer 812 to emit light L. The emitted light L is emitted through another surface 810c of the semiconductor structure 810.

The electrode structure includes a first electrode layer 830 and a second electrode layer 840 disposed on the second semiconductor layer 813, and a plating electrode layer 870 electrically connected to the first electrode layer 830 and the second electrode layer 840.

The first electrode layer 830 is electrically connected to the first semiconductor layer 811 through a contact hole 810a extended to the first semiconductor layer 811 from the second semiconductor layer 813. The contact hole 810a may be formed by using etching into a mesa structure or a vertical structure. A side surface of the contact hole 810a may be slanted to the stacked direction of the first semiconductor layer 811, the active layer 812, and the second semiconductor layer 813. A plurality of the contact holes 810a may be formed. For example, current spreading may be improved by forming the plurality of first electrode layers 830 as shown in FIG. 10A.

The second electrode layer 840 is disposed on the second semiconductor layer 813, and is electrically connected to the second semiconductor layer 813. The second electrode layer 840 may be disposed on a portion of the second semiconductor layer 813 (see FIG. 10B) where the contact hole 810a is not formed.

An insulating layer 820 is formed on the side surface of the contact hole 810a. The insulating layer 820 is coated on a portion of a top surface of the semiconductor structure 810 other than a portion where the first electrode layer 830 is located and a portion where the second electrode layer 840 is located. The first electrode layer 830 is insulated from the active layer 812, the second semiconductor layer 813, and the second electrode layer 840 due to the insulating layer 820.

The plating electrode layer 870 is disposed on the insulating layer 820. The plating electrode layer 870 includes a first electrode pad 871 and a second electrode pad 872 with an insulating barrier 880 therebetween. The first electrode pad 871 is disposed in a first electrode region where the first electrode layer 830 is located, and the second electrode pad 872 is disposed in a second electrode region where the second electrode layer 840 is located. The first electrode pad 871 and the second electrode pad 872 may be separated from each other by the insulating barrier 880. The insulating barrier 880 may be formed of a general insulating material, for example, polyimide.

The plating electrode layer 870 may be formed by plating a metal such as copper, nickel, or chromium to a thickness of tens of μm. In order to easily perform plating, a seed layer 850 may be disposed under the first electrode pad 871 and the second electrode pad 872.

Since the plating electrode layer 870 formed by using plating as described above provides electrical wiring and physical support to the semiconductor structure 810, the semiconductor light-emitting device 800 may easily achieve mass production and large scale fabrication and reduce manufacturing costs, unlike a conventional semiconductor light-emitting device that provides electrical wiring and physical support to the semiconductor structure 810 by bonding the semiconductor structure 810 to an electrode substrate.

Next, a method of manufacturing a semiconductor light-emitting device, according to another embodiment of the present invention, will be explained.

FIGS. 9A through 9K are cross-sectional views for explaining a method of manufacturing a semiconductor light-emitting device, according to another embodiment of the present invention. FIGS. 10A through 10D are plan views illustrating electrode patterns in a process of manufacturing a semiconductor light-emitting device, according to an embodiment of the present invention.

Referring to FIG. 9A, the semiconductor structure 810 is formed by sequentially forming the first semiconductor layer 811, the active layer 812, and the second semiconductor layer 813 by using crystal growth on a top surface of the substrate 802. Although not shown in FIG. 9A, a buffer layer (not shown) may be formed between the substrate 802 and the first semiconductor layer 811.

Figure 9B:
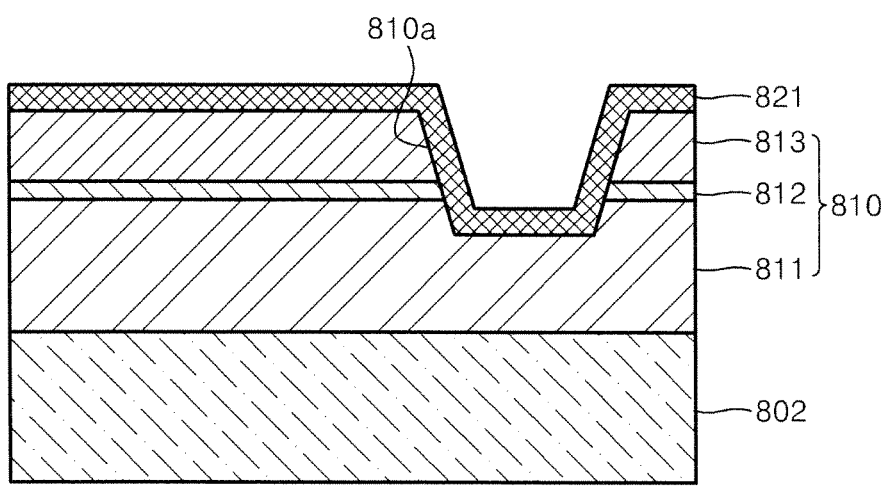

Referring to FIG. 9B, a portion of the first semiconductor layer 811 is exposed by forming the contact hole 810a by using etching to a predetermined depth from the second semiconductor layer 813. In this case, a plurality of the contact holes 810a may be formed to correspond to a plurality of the first electrode layers 830.

Next, a passivation layer 821 is coated by using deposition on an entire top surface of the semiconductor structure 810 including the contact hole 810a. For example, the passivation layer 821 may be formed by depositing SiO$_2$ to about 6000 Å by using PECVD.

Figure 9C:
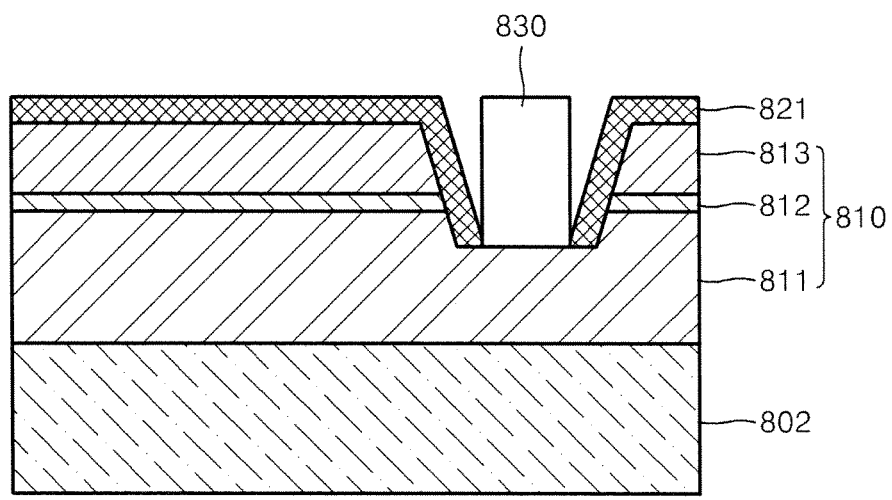

Referring to FIG. 9C, a portion of the first semiconductor layer 811 is exposed by etching a portion of the passivation layer 821 formed on a bottom of the contact hole 810a. The etching may be performed by using RIE and a BOE. Next, the first electrode layer 830 is formed on the exposed portion of the first semiconductor layer 811.

The first electrode layer 830 may be formed of a material including at least one selected from the group consisting Al, Ti, Pt, Ag, Ni, TiN, Au, Sn, and a mixture thereof, and may have a single-layer structure or a multi-layer structure including a plurality of layers formed of different materials. A thickness of each layer may range from 0.1 to 5000 nm. For example, the first electrode layer 830 may be formed by depositing a Al/Ti/Pt/Ti layer to a thickness of 200 nm/300 nm/100 nm/2 nm in the present embodiment. In this case, current spreading to the first semiconductor layer 811 may be improved by forming a plurality of the first electrode layers 830 as shown in FIG. 10A. The plurality of first electrode layers 830 may be arranged in a matrix, in order to achieve optimal current spreading. After the first electrode layer 830 is formed, heat treatment for forming an ohmic contact is performed. In the present embodiment, good ohmic characteristics are obtained by performing RTA as heat treatment at 550° C. for 60 seconds. While a temperature and a time of heat treatment may vary according to a material of an ohmic electrode, the heat treatment may be performed at 300 to 800° C. for about 5 to 5000 seconds, and preferably, may be performed at 300 to 600° C. for about 30 to 180 seconds.

The contact holes 180 may be arranged in a matrix in consideration of current spreading and light extraction.

Figure 9D:
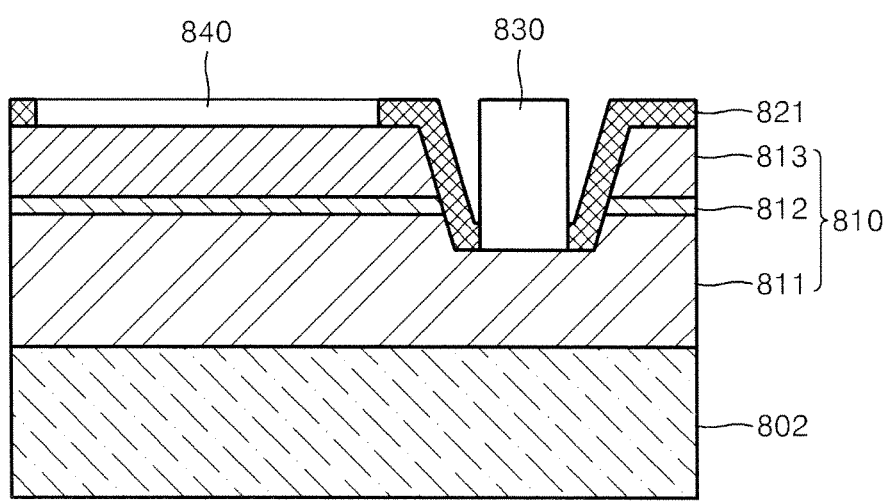
Figure 10B:
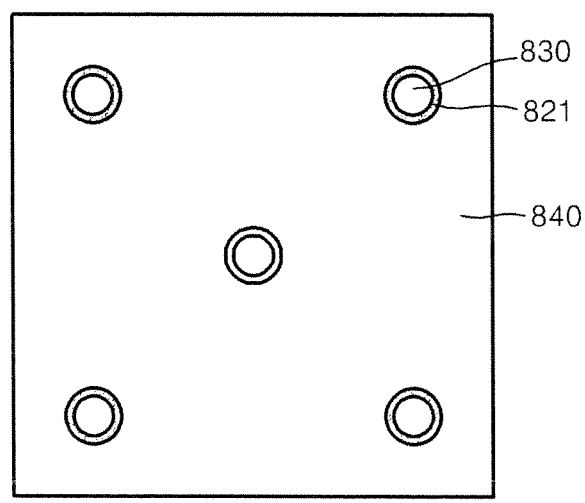

Referring to FIG. 9D, the second semiconductor layer 813 is exposed by etching a portion of the passivation layer 821 other than a portion that surrounds the first electrode layer 830. The etching may be performed by using RIE or a BOE. Next, the second electrode layer 840 is formed on the exposed second semiconductor layer 813. In this case, the second electrode layer 840 is formed to be spaced apart from the first electrode layer 830 as shown in FIG. 10B. The second electrode layer 840 may be formed of a metal that has both ohmic characteristics and light reflecting characteristics to act as a reflective layer, or may have a multi-layer structure by formed sequentially stacking metals having ohmic characteristics and light reflecting characteristics. For example, the second electrode layer 840 may be formed by depositing a Ag/Ni/Ti/TiN layer to a thickness of 150 nm/50 nm/50 nm/400 nm. After the second electrode layer 840 is formed, heat treatment for forming an ohmic contact is performed. Good ohmic characteristics are obtained by performing RTA as heat treatment at 350° C. for 60 seconds in the present embodiment. While a temperature and a time of heat treatment may vary according to a material of an ohmic electrode, the heat treatment may be performed at 300 to 800° C. for about 5 to 5000 seconds, and preferably, may be performed at 300 to 600° C. for 30 to 180 seconds.

Figure 9E:
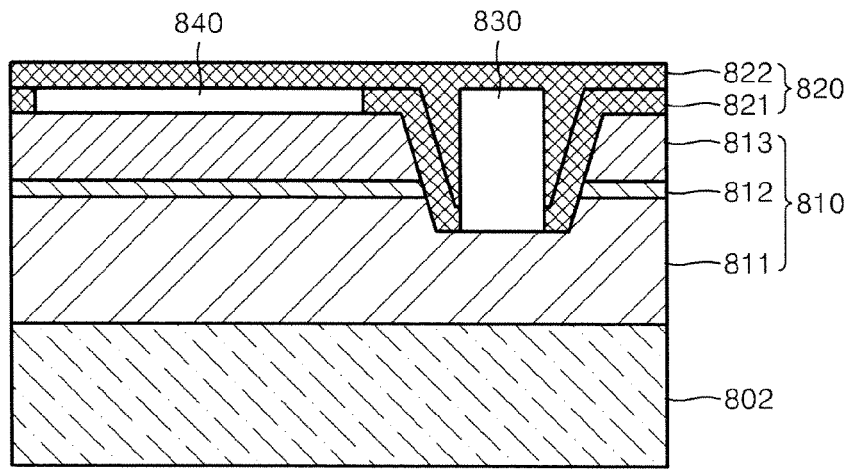
Figure 9F:
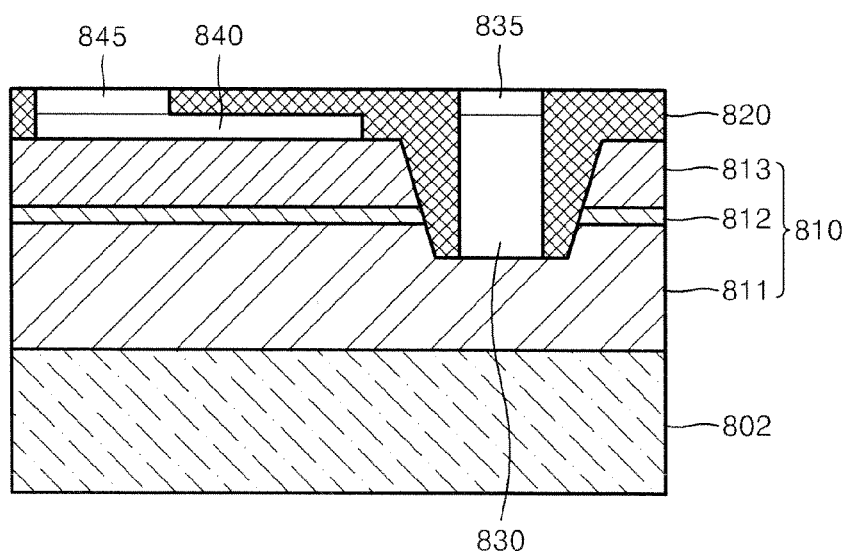
Figure 10C:
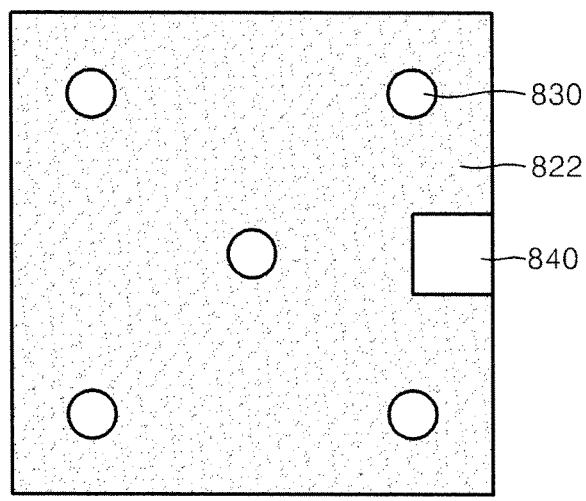

Referring to FIG. 9E, an insulating material layer 822 is coated to a predetermined thickness on a top surface of the semiconductor structure 810. The insulating material layer 822 is coated on entire top surfaces of the first electrode layer 830, the second electrode layer 840, and the passivation layer 821. The insulating material layer 822 may be formed by depositing SiO$_2$ to a thickness of about 8000 Å by using PECVD. The passivation layer 821 and the insulating material layer 822 may be formed of the same material, and may constitute the insulating layer 820 that insulates the first electrode layer 830 from the second electrode layer 840. A thickness of the insulating material layer 822 is great enough to cover a top surface of the first electrode layer 830, and may preferably range from 100 to 10000 nm. A thickness of the insulating layer 820 may range from 200 to 20000 nm. Referring to FIG. 9F, the first electrode layer 830 and the second electrode layer 840 are exposed by etching the insulating layer 820. In this case, if a plurality of the first electrode layers 830 are formed, all of the first electrode layers 830 are exposed as shown in FIG. 10C. Meanwhile, only a predetermined portion of the second electrode layer 840 may be exposed. The exposed first electrode layer 830 and second electrode layer 840 may be filled with metal materials 835 and 845 such as copper, nickel, or chromium. If a plurality of the first electrode layers 830 are formed, the metal material 835 may be formed to connect the plurality of first electrode layers 830. This process may be inferred from a process illustrated in FIG. 3F, and thus a detailed explanation thereof will not be given.

Figure 9G:
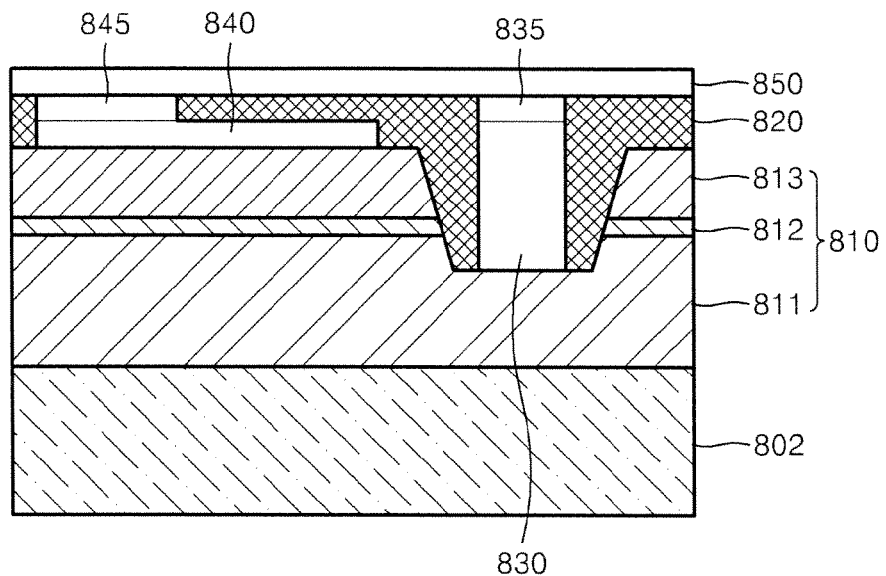

Referring to FIG. 9G, the seed layer 850 for plating is formed on the first electrode layer 830 and the second electrode layer 840.

Figure 9H:
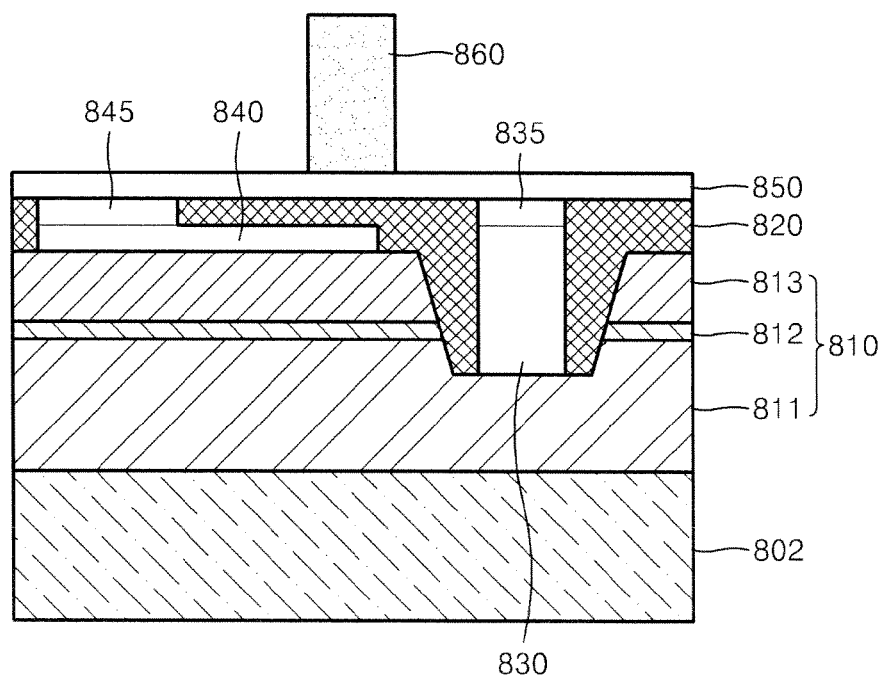

Referring to FIG. 9H, a photoresist 860 is formed on the seed layer 850. The photoresist 860 is formed over the insulating layer 820.

Figure 9I:
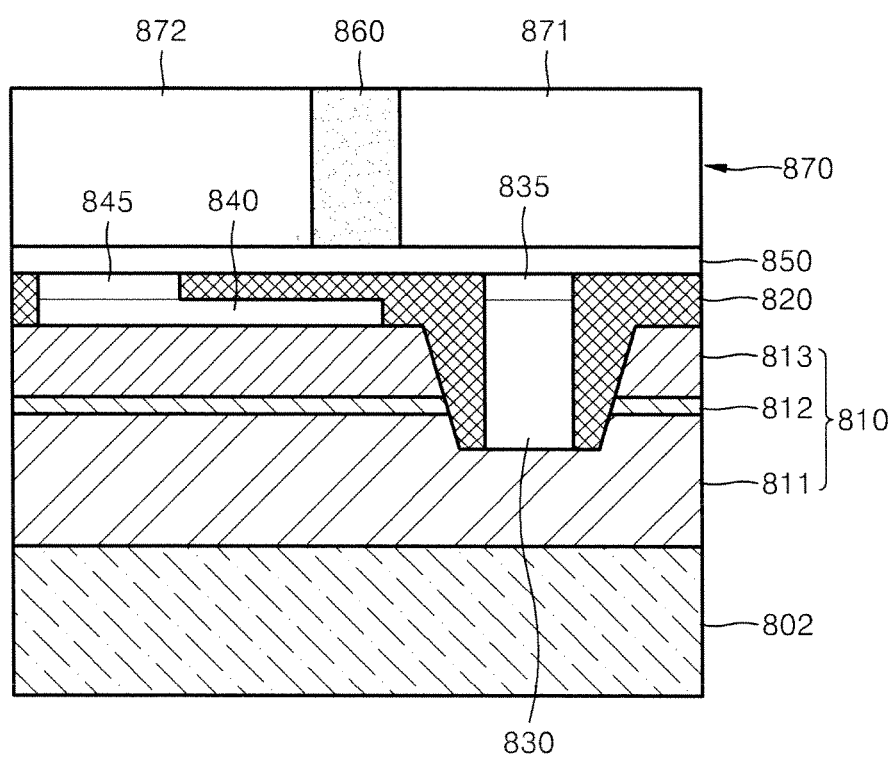
Figure 10D:
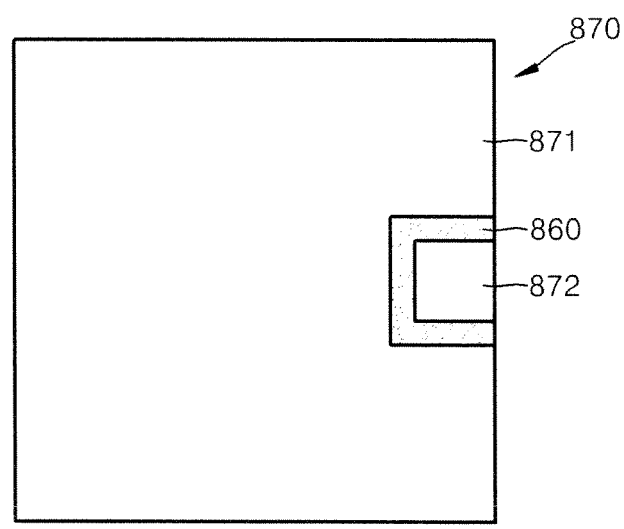

Referring to FIG. 9I, the plating electrode layer 870 is formed by using plating on the seed layer 850. The plating electrode layer 870 includes the first electrode pad 871 and the second electrode pad 872 with the photoresist 860 therebetween. Each of the first electrode pad 871 and the second electrode pad 872 may be formed to a thickness of 5 to 500 μm and may be formed of a metal such as copper, nickel, or chromium. The first electrode pad 871 and the second electrode pad 872 are formed with the photoresist 860 therebetween as shown in FIG. 10D.

Figure 9J:
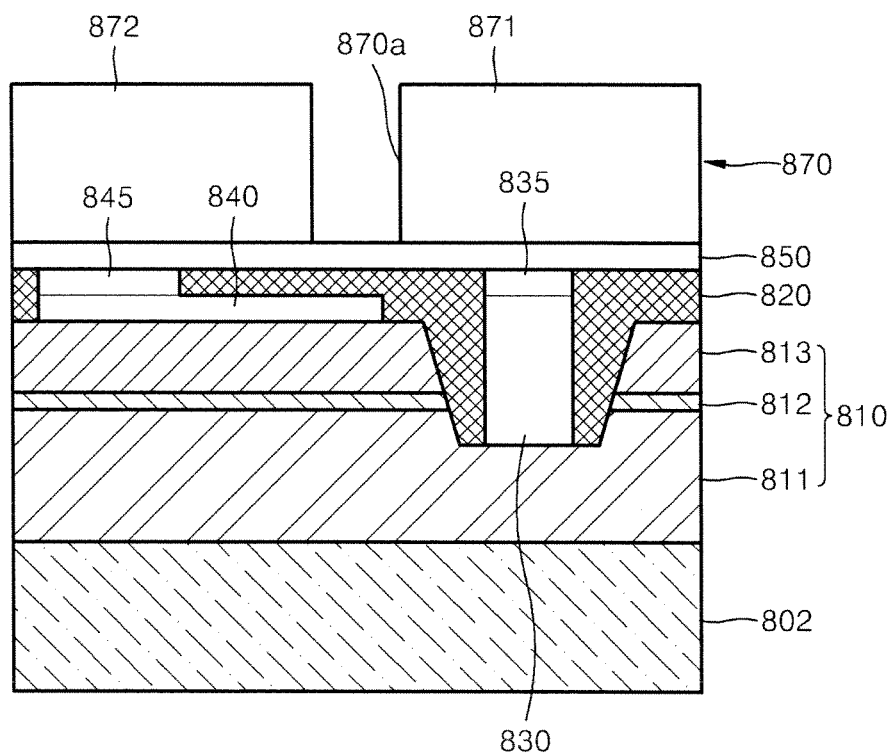

Referring to FIG. 9J, a gap 870a is formed between the first electrode pad 871 and the second electrode pad 872 by removing the photoresist 860.

Figure 9K:
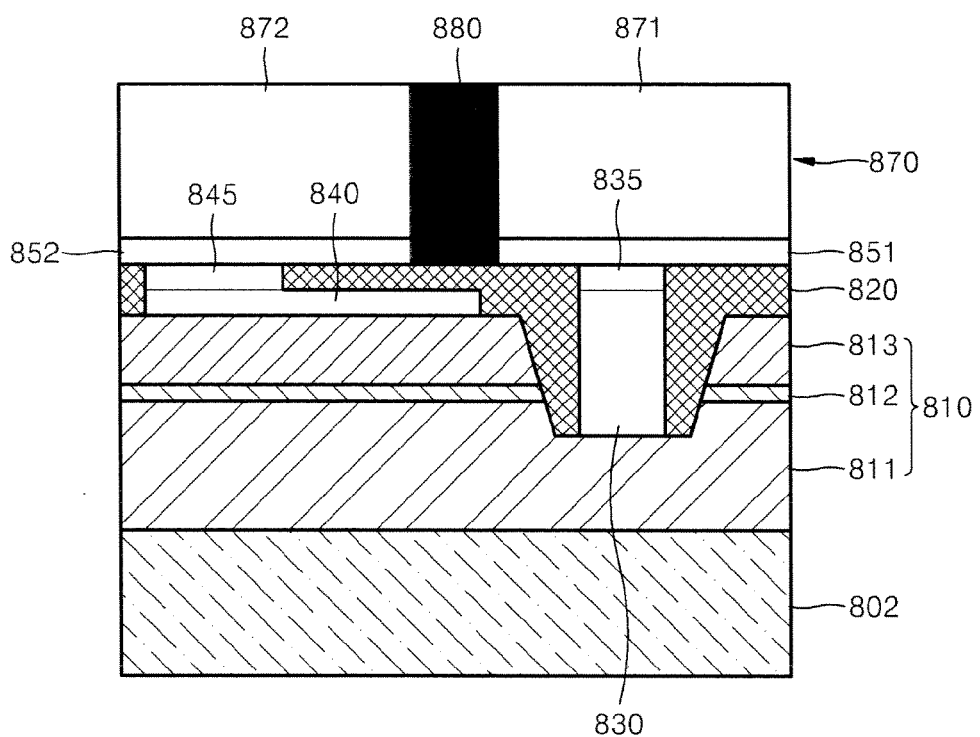
Figure 9L:
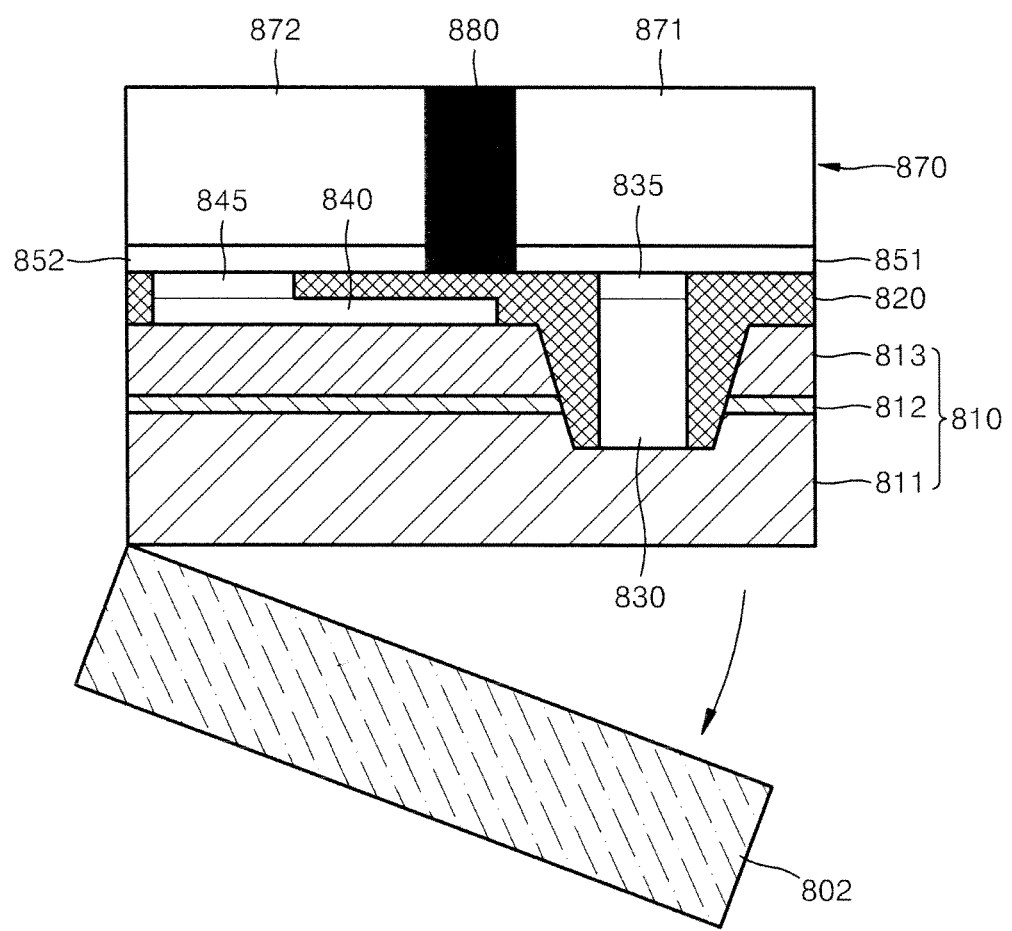

Referring to FIGS. 9K and 9L, the seed layer 850 is divided into a first seed layer 851 and a second seed layer 852 by etching the seed layer 850. The first seed layer 851 forms the insulating barrier 880 by filling the gap 870a where the photoresist 860 is located with an insulating material. After the insulating barrier 880 is formed, a surface of the plating electrode layer 870 may be planarized by performing chemical mechanical polishing (CMP) or the like. Next, the substrate 802, which is a base on which crystal growth occurs, is removed by performing laser lift-off or the like. The area of the first seed layer 851 may be larger than that of the first electrode layer 830, and the area of the second seed layer 852 may be larger than that of the second electrode layer 840.

Since the plating electrode layer 870 is formed by using plating as described above, an electrode substrate does not need to be prepared and the semiconductor structure 810 does not need to be bonded to the electrode substrate. Accordingly, the method of manufacturing the semiconductor light-emitting device according to the present embodiment may reduce manufacturing costs and easily achieve mass production and large scale fabrication. Also, since the plating electrode layer 870 is formed on one surface of the semiconductor structure 810, packaging may be possible at a chip level through a flip-chip process. Furthermore, since the plating electrode layer 870 is formed of a metal having high thermal conductivity, a light-emitting device chip having high heat dissipation effect, ensuring long operation, and providing high reliability and high output may be realized.

Also, if an electrode structure is formed on one surface in a conventional semiconductor light-emitting device, since an electrode substrate is attached to the semiconductor structure 810, the risk of misalignment is high when the electrode substrate is attached to the semiconductor structure 810 due to the bowing of a wafer. However, since an electrode substrate does not need to be attached, the semiconductor light-emitting device according to the present embodiment does not cause misalignment or the like.

Figure 11:
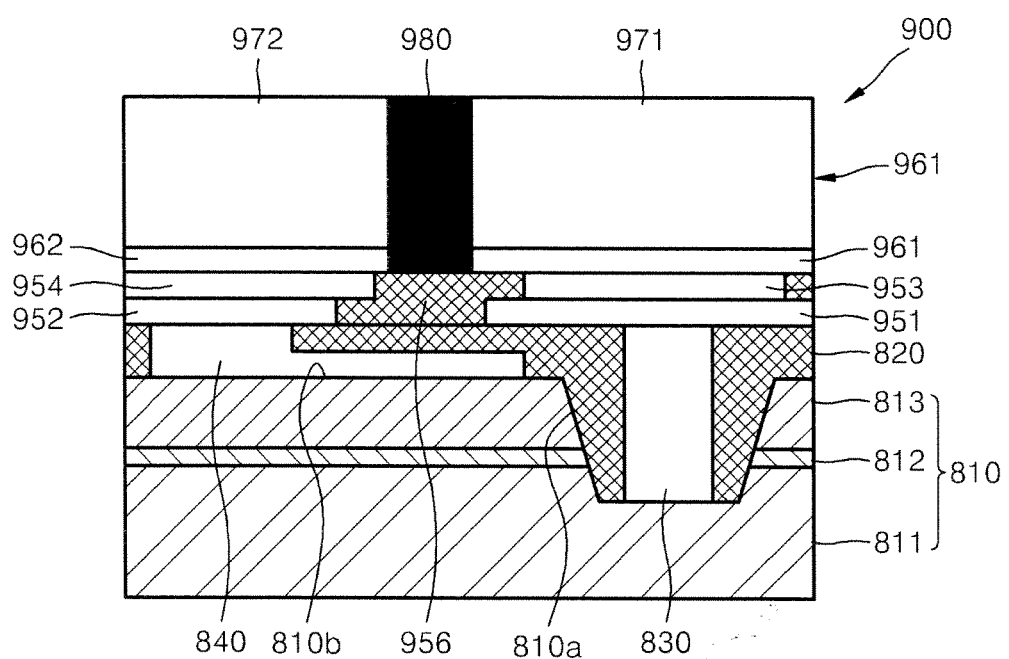
FIG. 11 is a cross-sectional view illustrating a semiconductor light-emitting device according to another embodiment of the present invention.

FIG. 11 is a cross-sectional view illustrating a semiconductor light-emitting device 900 according to another embodiment of the present invention.

Referring to FIG. 11, the semiconductor light-emitting device 900 includes the semiconductor structure 810, and an electrode structure disposed on one surface 810b of the semiconductor structure 810.

Figure 12A:
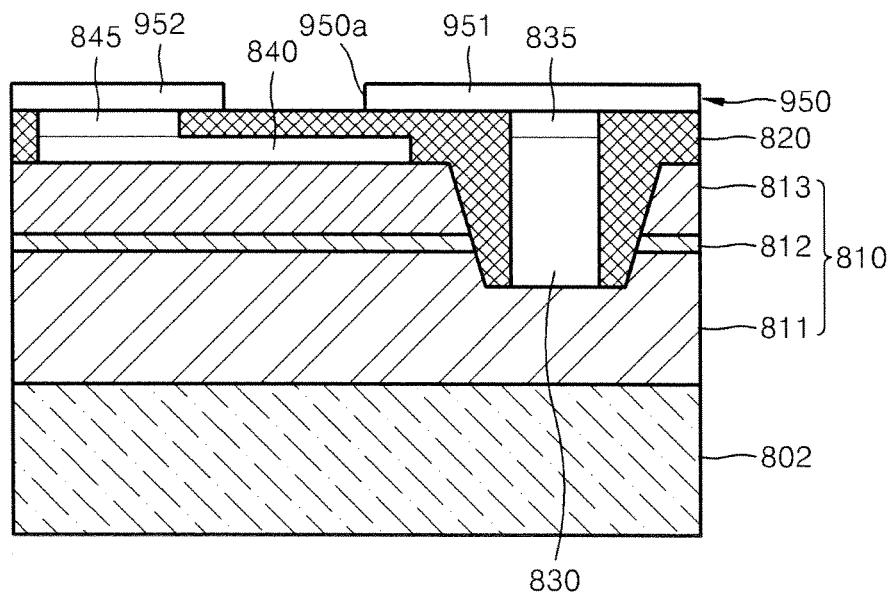
FIGS. 12A through 12G are cross-sectional views for explaining a method of manufacturing a semiconductor light-emitting device, according to another embodiment of the present invention.

The semiconductor structure 810 includes the first semiconductor layer 811, the active layer 812, and the second semiconductor layer 813 formed by using crystal growth on the substrate 802 (see FIG. 12A). The substrate 802, which is a base on which crystal growth occurs, may be removed as will be described later.

The electrode structure includes the first electrode layer 830 and the second electrode layer 840 disposed on the second semiconductor layer 813, and a plating electrode layer 970 electrically connected to the first electrode layer 830 and the second electrode layer 840.

The first electrode layer 830 is electrically connected to the first semiconductor layer 811 through the contact hole 810a formed in the first semiconductor layer 811 from the second semiconductor layer 813. The contact hole 810a may be formed by using etching into a mesa structure or a vertical structure. A plurality of the contact holes 810a may be formed. Current spreading may be improved by forming the plurality of first electrode layers 830.

The second electrode layer 840 is disposed on the second semiconductor layer 813 to be electrically connected to the second semiconductor layer 813. The second electrode layer 840 may be disposed on a portion where the contact hole 810a of the second semiconductor layer 813 is not formed.

The insulating layer 820 is coated on a portion of a top surface of the semiconductor structure 810 other than a portion where the first electrode layer 8360 is located and a portion where the second electrode layer 840 is located. The first electrode layer 830 is insulated from the active layer 812, the second semiconductor layer 813, and the second electrode layer 840 due to the insulating layer 820.

A first metal layer 951 and a second metal layer 952 respectively connected to the first electrode layer 830 and the second electrode layer 840 are formed on the insulating layer 820. The first metal layer 951 to be connected to the plurality of first electrode layers 930 has a large area, whereas the second metal layer 952 is formed only on a predetermined portion. Although an area of the first metal layer 951 may vary according to a size of the light-emitting device 900, it is preferable that a size of the first metal layer 951 is equal to or greater than 3 times an area of the second metal layer 952. A third metal layer 953 and a fourth metal layer 954 are formed to be connected to the first metal layer 951 and the second metal layer 952. The third metal layer 953 is formed to have an area smaller than that of the first metal layer 951, and the fourth metal layer 954 is formed to have an area similar to that of the second metal layer 952.

An insulating layer 956 is filled in a gap between the first metal layer 951 and the second metal layer 952 and a gap between the third metal layer 953 and the fourth metal layer 954, to insulate the first metal layer 951 and the second metal layer 952 and to insulate the third metal layer 953 and the fourth metal layer 954.

An insulating barrier 980 is formed on the insulating layer 956. A first seed layer 961 and a second seed layer 962 respectively connected to the third metal layer 953 and the fourth metal layer 954 are formed on both sides of the insulating barrier 980. A first electrode pad 971 and a second electrode pad 972 are respectively formed on the first seed layer 961 and the second seed layer 962. The first electrode pad 971 and the second electrode pad 972 may be formed by using plating. Each of the first electrode pad 971 and the second electrode pad 972 may have a thickness ranging from 15 to 500 μm, and may be formed of a material including at least one selected from the group consisting of Al, Ti, Pt, Ag, Ni, TiN, Au, Sn, and a mixture thereof. If a thickness of each of the first electrode pad 971 and the second electrode pad 972 is less than 15 μm, each of the first electrode pad 971 and the second electrode pad 972 may not act as a support substrate, and if a thickness is greater than 500 μm, it may taken a long time to perform plating and costs may be increased. A width of the insulating barrier 980 (that is, an interval between the first electrode pad 971 and the second electrode pad 972) may preferably range from 1 to 500 μm. If a width of the insulating barrier 980 is equal to or less than 1 μm, it may be difficult to perform an insulating process between the electrodes 971 and 972. If a width of the insulating barrier 980 is equal to or greater than 500 μm, sizes of the electrode pads 971 and 972 may be relatively reduced, heat generated in the light-emitting device 900 may not be effectively removed, a temperature of the light-emitting device 900 may be increased, and thus performance, e.g., luminance, of the light-emitting device 900 may be reduced.

Since a metal layer and an insulating layer are formed between the first electrode layer 830 and the second electrode layer 840, and between the first seed layer 961 and the second seed layer 962, an area of the second electrode pad 972 may be increased, and thus the semiconductor light-emitting device 900 may easily change positions and areas of the first and second electrode pads 971 and 972 for the purpose of connection with a substrate including a contact.

A method of manufacturing a semiconductor light-emitting device according to another embodiment of the present invention will be explained.

FIGS. 12A through 12G are cross-sectional views for explaining a method of manufacturing a semiconductor light-emitting device, according to another embodiment of the present invention. FIGS. 13A through 13C are plan views illustrating electrode patterns in a process of manufacturing a semiconductor light-emitting device, according to another embodiment of the present invention.

FIG. 12A illustrates a process subsequent to processes of FIGS. 9A through 9F, and a detailed explanation of the processes of FIGS. 9A through 9F will not be given.

Referring to FIG. 12A, a metal layer (not shown) is formed on the first electrode layer 830 and the second electrode layer 840, and the first metal layer 951 and the second metal layer 952 respectively connected to the first electrode layer 830 and the second electrode layer 840 are formed by patterning the metal layer. Referring to FIG. 13A, the first metal layer 951 to be connected to the plurality of first electrode layers 830 has a large area, whereas the second metal layer 952 is formed only on a predetermined portion. The first metal layer 951 and the second metal layer 952 may be formed along with the metal materials 835 and 845 in the process of FIG. 9F which is a previous process.

Figure 12B:
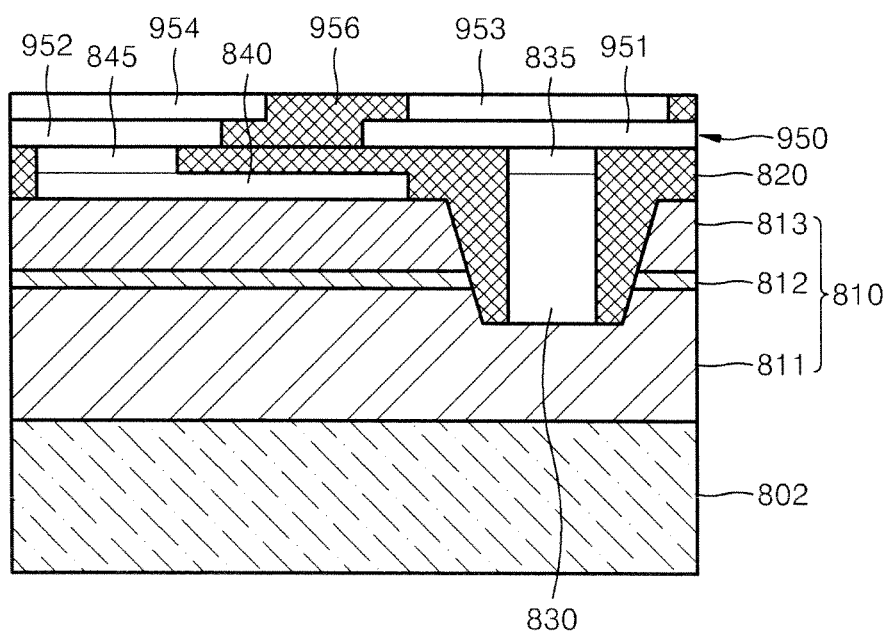
Figure 13A:
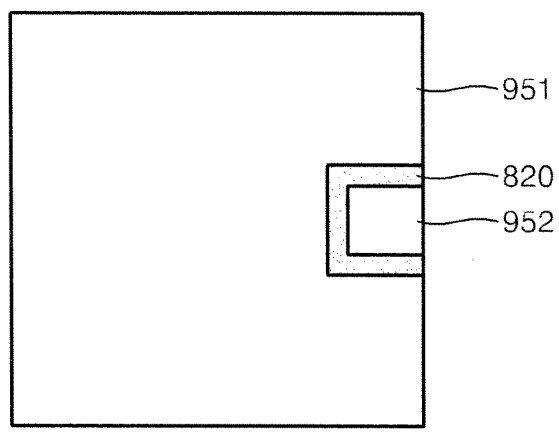
FIGS. 13A through 13C are plan views illustrating electrode patterns in a process of manufacturing a semiconductor light-emitting device, according to another embodiment of the present invention.
Figure 13B:
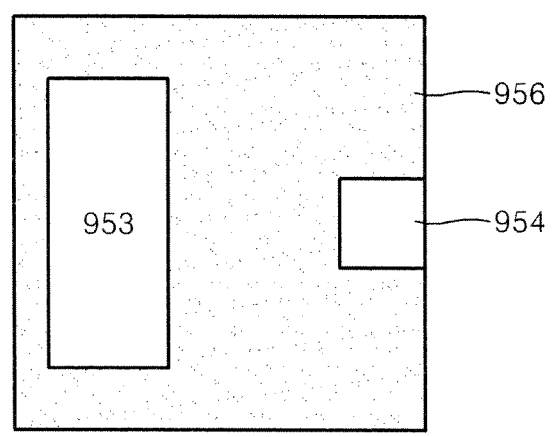
Figure 13C:
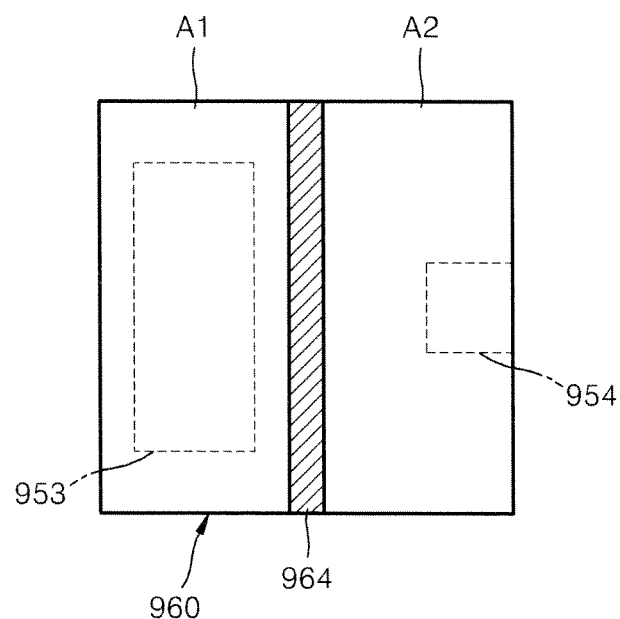

Referring to FIG. 12B, the insulating layer 956 is formed on the insulating layer 820 to cover the first metal layer 951 and the second metal layer 952. Next, portions of the first metal layer 951 and the second metal layer 952 are exposed by patterning the insulating layer 956, and then the third metal layer 953 and the fourth metal layer 954 are formed on the exposed portions to be connected to the first metal layer 951 and the second metal layer 952, respectively. Referring to FIGS. 13A and 13B, the third metal layer 953 is formed to have an area less than that of the first metal layer 951, and the fourth metal layer 954 is formed to have an area that is 0.5 to 3 times an area of the second metal layer 952.

Figure 12C:
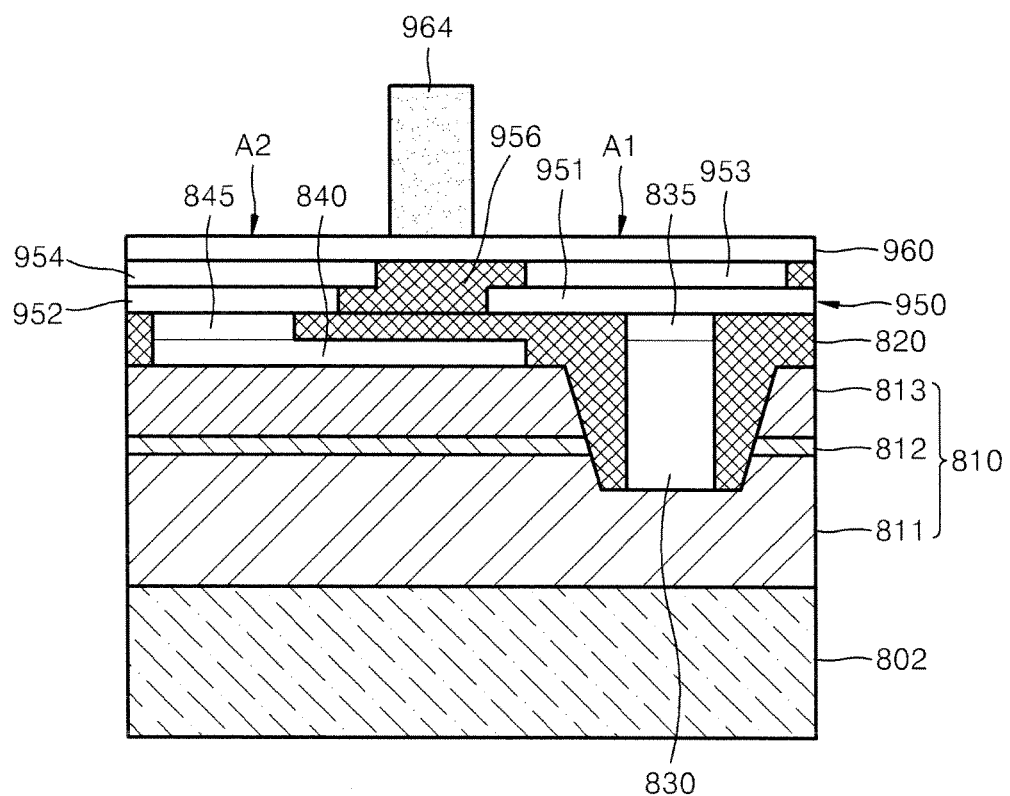

Referring to FIG. 12C, a seed layer 960 for plating is formed on the insulating layer 956 to cover the third metal layer 953 and the fourth metal layer 954. Next, a photoresist 964 is formed on the seed layer 960 to divide the seed layer 960 into first and second portions A1 and A2. Referring to FIG. 13C, the first portion A1 and the second portion A2 respectively contact the third metal layer 953 and the fourth metal layer 954. The second portion A2 has an area that is 1 to 5 times an area of the fourth metal layer 954.

Figure 12D:
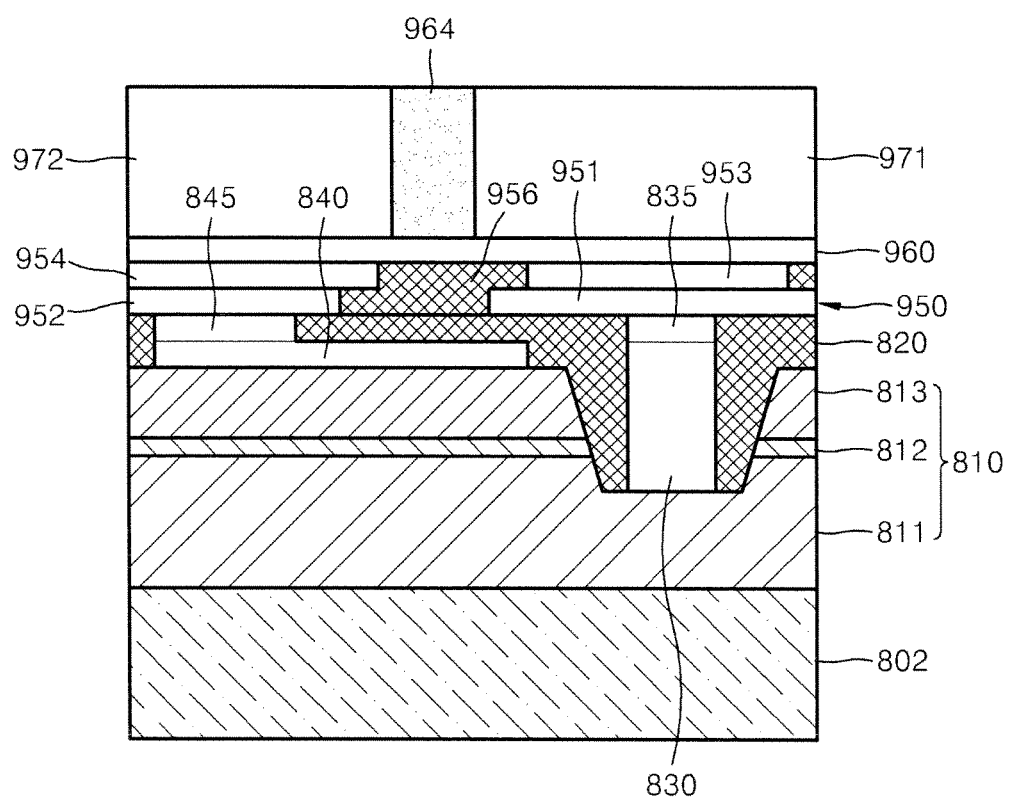

Referring to FIG. 12D, a first electrode pad 971 and a second electrode pad 972 are respectively formed by performing plating on the first portion A1 and the second portion A2 with the photoresist 964 therebetween. Each of the first electrode pad 971 and the second electrode pad 972 may be formed of a metal such as copper, nickel, or chromium, to a thickness of 15 to 500 μm.

Figure 12E:
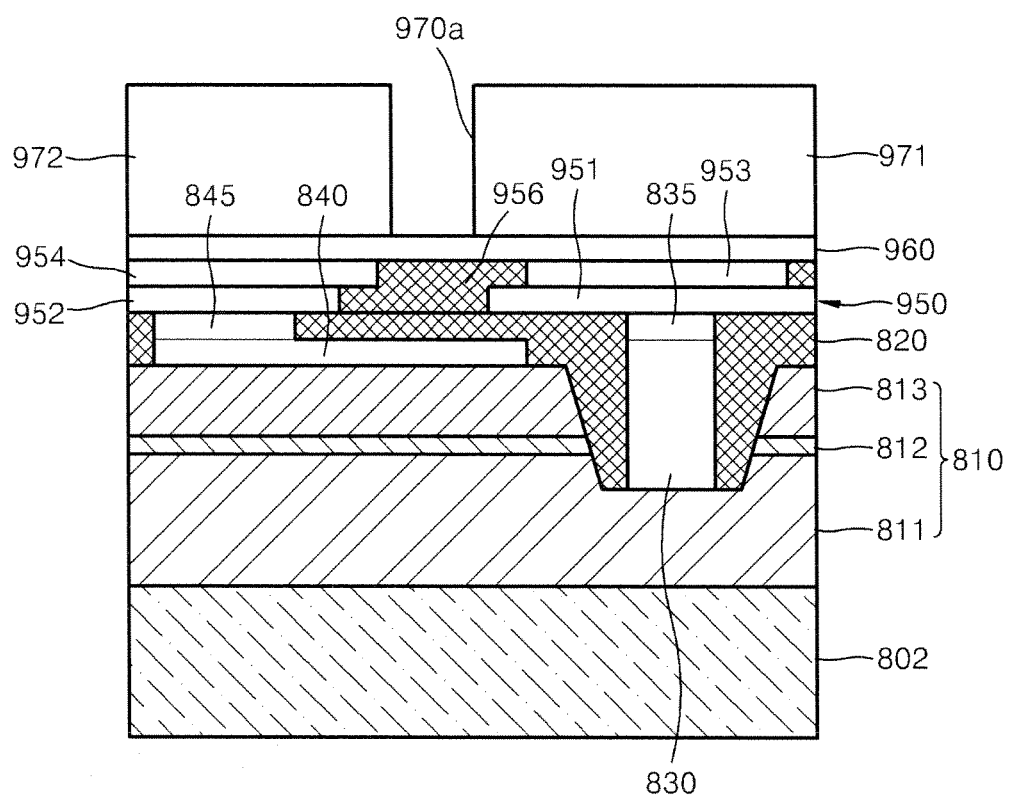

Referring to FIG. 12E, a gap 970a is formed between the first electrode pad 971 and the second electrode pad 972 by removing the photoresist 964. A width of the gap 970a (that is, an interval between the first electrode pad 971 and the second electrode pad 972) preferably ranges from about 1 to 500 μm. If a width of the gap 970a is equal to or less than 1 μm, it may be difficult to perform insulating between the first and second electrode pads 971 and 972. If a width of the gap 970a is equal to or greater than 500 μm, an area of each of the first and second electrode pads 971 and 972 may be relatively reduced, heat generated in the light-emitting devices may not be effectively emitted, a temperature of the light-emitting device may be increased, and thus performance, e.g., luminance, of the light-emitting device may be reduced.

Figure 12F:
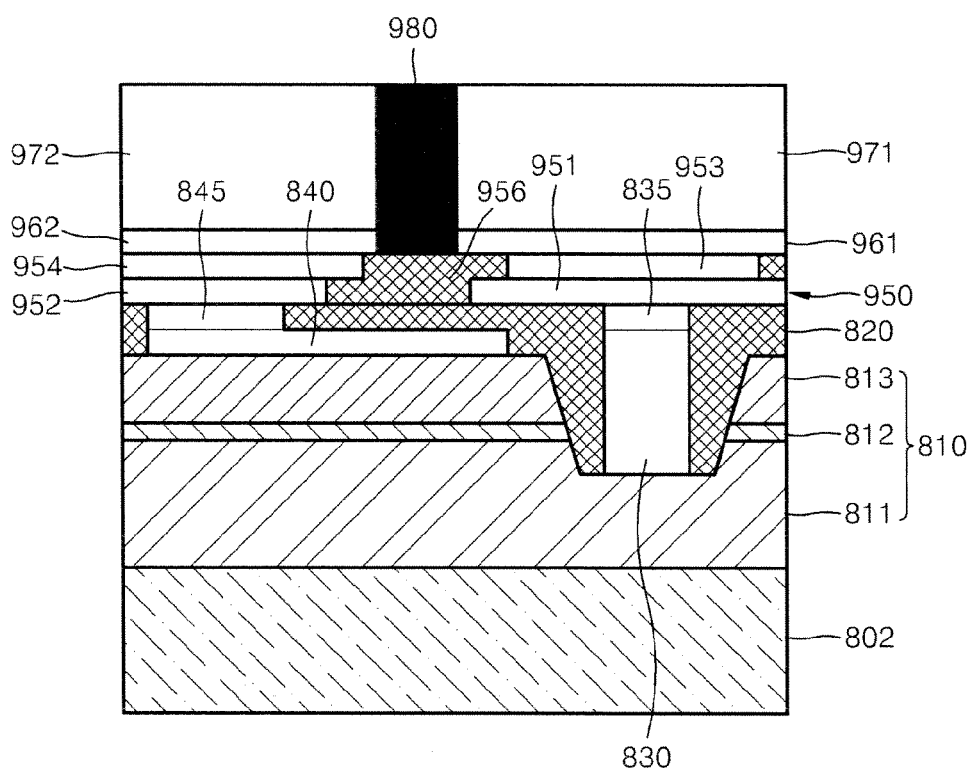

Referring to FIG. 12F, the seed layer 960 exposed by the gap 970a is divided into the first seed layer 961 and the second seed layer 962 by etching the seed layer 960. Next, an insulating barrier 980 is formed by filling an etched region between the first seed layer 961 and the second seed layer 962 and the gap 970a. After the insulating barrier 980 is formed, surfaces of the first electrode pad 971 and the second electrode pad 972 may be planarized by using CMP or the like.

Figure 12G:
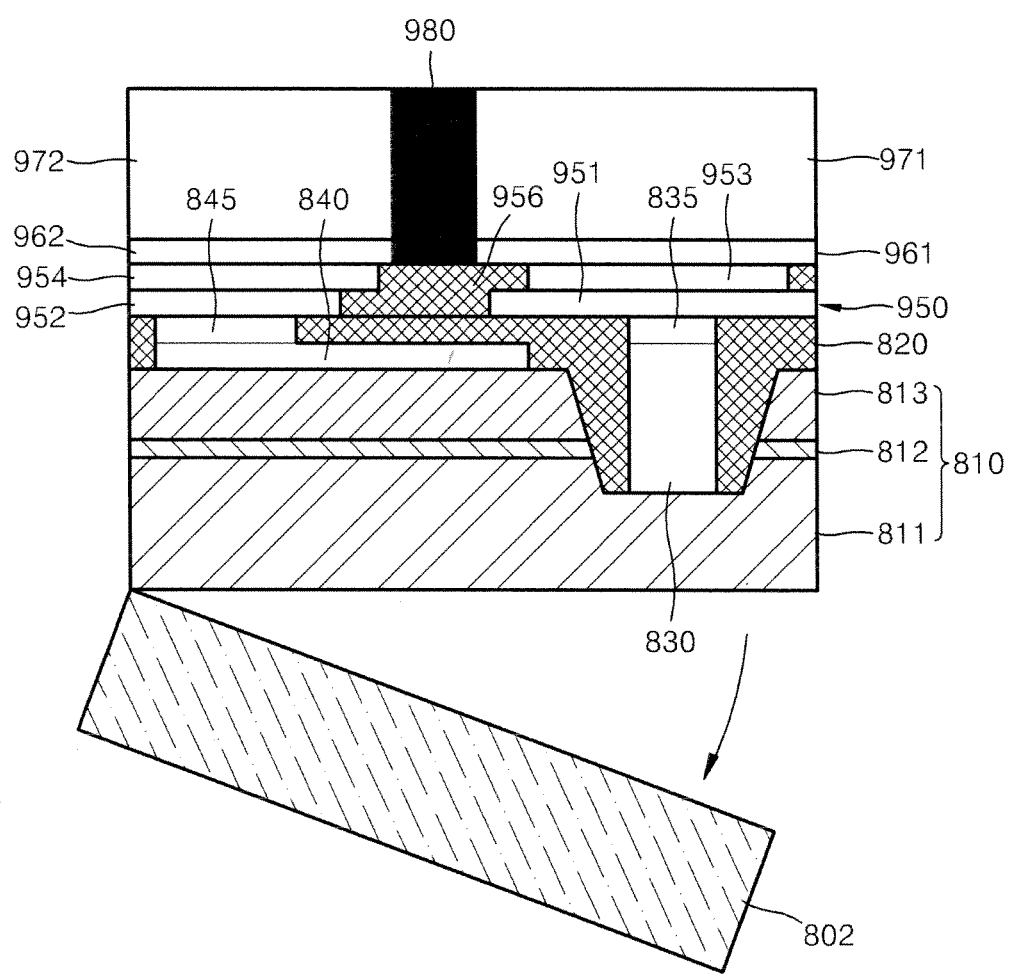

Referring to FIG. 12G, the substrate 802, which is a base on which crystal growth occurs, is removed by using laser lift-off or the like.

According to the present embodiment, since an electrode pad may be formed by using plating and an electrode pad forming area may be easily designed as described above, a light-emitting device may be easily installed on a substrate in which another contact is formed.

As described above, according to the one or more of the above embodiments of the present invention, since a semiconductor light-emitting device and a method of manufacturing the same supply current to an n-type semiconductor and a p-type semiconductor from a bottom surface of a light-emitting structure, light extraction efficiency may be improved. Since direct die bonding may be performed without wire bonding, reliability of the semiconductor light-emitting device may be improved.

Also, since an area connected to a second electrode layer is increased, electrical connection to a separate substrate in which a contact is formed may be facilitated.

Also, since a thick metal layer formed by using plating is used as a support substrate, mass production and large area fabrication may be easily achieved and manufacturing costs may be reduced.

While the present invention has been particularly shown and described with reference to exemplary embodiments thereof using specific terms, the embodiments and terms have been used to explain the present invention and should not be construed as limiting the scope of the present invention defined by the claims. The preferred embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A method of manufacturing a semiconductor light-emitting device, the method comprising:
   sequentially forming a first semiconductor layer, an active layer, and a second semiconductor layer on a first substrate;
   forming a contact hole through which the first semiconductor layer is exposed from the second semiconductor layer, and forming a contact layer in the contact hole to be connected to the first semiconductor layer;
   forming a second electrode layer on the second semiconductor layer to surround the contact hole;
   forming a first insulating layer on the second electrode layer;
   forming a first electrode layer on the first insulating layer to be connected to the contact layer;

adhering a second substrate to the first electrode layer and removing the first substrate;

forming a first through-hole that is connected to the first electrode layer and a second through-hole that is connected to the second electrode layer from an exposed surface of the second substrate; and forming a first contact and a second contact that are respectively connected to the first electrode layer and the second electrode layer by filling the first through-hole and the second through-hole with metals.

2. The method of claim 1, wherein the forming of the contact hole further comprises:

forming a second insulating layer that covers the contact hole; and exposing the first semiconductor layer by etching a portion of the second insulating layer formed on a bottom of the contact hole, and the forming of the contact layer comprises forming the contact layer on the exposed first semiconductor layer.

3. The method of claim 1, wherein the forming of the contact hole and the contact layer comprises forming a plurality of contact holes and a plurality of contact layers.

4. The method of claim 3, wherein the forming of the second electrode layer comprises:

forming a third insulating layer on the second semiconductor layer;

exposing the second semiconductor layer by removing the third insulating layer that surrounds the contact hole; and forming the second electrode layer on the exposed second semiconductor layer.

5. The method of claim 1, wherein the second electrode layer comprises at least one material selected from the group consisting of Ag, Al, Pt, Ni, Pd, Ti, Au, Ir, W, Sn, an oxide thereof, and a mixture thereof.

6. The method of claim 1, wherein the forming of the first electrode layer comprises:

etching the first insulating layer to expose the contact layer; and forming the first electrode layer to cover the exposed contact layer.

7. The method of claim 1, wherein the forming of the second through-hole further comprises forming a fourth insulating layer on an inner circumferential surface of the second through-hole.

8. The method of claim 1, wherein the second substrate is a non-conductive substrate comprises any one material selected from the group consisting of alumina, aluminum nitride, sapphire, and polymer.

9. A method of manufacturing a semiconductor light-emitting device, the method comprising:

sequentially stacking a first semiconductor layer, an active layer, and a second semiconductor layer on a first substrate;

forming a contact hole through which the first semiconductor layer is exposed from the second semiconductor layer, and forming a contact layer in the contact hole to be connected to the first semiconductor layer;

forming a second electrode layer on the second semiconductor layer to surround the contact hole;

forming a first insulating layer on the second electrode layer;

forming a first electrode layer on the first insulating layer to be connected to the contact layer;

forming a first through-hole in a second substrate to be connected to the first electrode layer, and a second through-hole in the second substrate to be connected to the second electrode layer;

forming a first contact and a second contact that are respectively connected to the first electrode layer and the second electrode layer by filling the first through-hole and the second through-hole with metals; and forming a third contact that is connected to the second electrode layer from an exposed surface of the first electrode layer and is insulated from the first electrode layer;

adhering the second substrate to the first electrode layer such that the third contact contacts the second contact; and removing the first substrate.

10. The method of claim 9, further comprising forming a second insulating layer on inner circumferential surfaces of the first through-hole and the second through-hole and on a surface of the second substrate.

11. The method of claim 10, wherein the second substrate comprises any one selected from the group consisting of Si, Ge, Si containing Al, and GaN.

12. The method of claim 9, wherein the forming of the contact hole comprises:

forming a third insulating layer to cover the contact hole; and exposing the first semiconductor layer by etching a portion of the third insulating layer formed on a bottom of the contact hole, and the forming of the contact layer comprises forming the contact layer on the exposed first semiconductor layer.

13. The method of claim 12, wherein the forming of the second electrode layer comprises:

forming a fourth insulating layer on the second semiconductor layer;

exposing the second semiconductor layer by removing a portion of the fourth insulating layer that surrounds the contact hole; and forming the second electrode layer on the exposed second semiconductor layer.

14. The method of claim 9, wherein the forming of the contact hole and the contact layer comprises forming a plurality of contact holes and a plurality of contact layers.

15. The method of claim 9, wherein the second electrode layer comprises at least one material selected from the group consisting of Ag, Al, Pt, Ni, Pd, Ti, Au, Ir, W, Sn, an oxide there of and a mixture thereof.

16. The method of claim 9, wherein the forming of the first electrode layer comprises:

etching the first insulating layer to expose the contact layer; and forming the first electrode layer to cover the exposed contact layer.

17. A method of manufacturing a semiconductor light-emitting device, the method comprising:

sequentially forming a first semiconductor layer, an active layer, a second semiconductor layer, and a second electrode layer on a first substrate;

forming a contact hole through which the first semiconductor layer is exposed from the second electrode layer;

forming a first insulating layer on the second electrode layer to cover an inner circumferential surface of the contact hole;

exposing the first semiconductor layer by etching a bottom of the contact hole;

forming a first electrode layer on the first insulating layer to contact the exposed first semiconductor layer;

adhering a second substrate to the first electrode layer and removing the first substrate;

forming a first through-hole connected to the first electrode layer and a second through-hole connected to the second electrode layer from an exposed surface of the second substrate; and forming a first contact and a second contact respectively connected to the first electrode layer and the second electrode layer by filling the first through-hole and the second through-hole with metals.

18. The method of claim 17, wherein the forming of the contact hole comprises forming a plurality of contact holes.

19. The method of claim 17, wherein the second electrode layer comprises at least one material selected from the group consisting of Ag, Al, Pt, Ni, Pd, Ti, Au, Ir, W, Sn, an oxide there of, and a mixture thereof.

20. The method of claim 17, wherein the forming of the second through-hole comprises forming a second insulating layer on an inner circumferential surface of the second through-hole.

21. The method of claim 17, wherein the second substrate is a non-conductive substrate comprising any one material selected from the group consisting of alumina, aluminum nitride, and sapphire.

22. The method of claim 17, further comprising forming a second insulating layer on inner circumferential surfaces of the first through-hole and the second through-hole and on a surface of the second substrate.

23. The method of claim 22, wherein the second substrate is a conductive substrate comprising any one selected from the group consisting of Si, Ge, Si containing Al, and GaN.

24. The method of claim 17, wherein the forming of the contact hole comprises forming a plurality of contact holes.

25. The method of claim 17, wherein the second electrode layer comprises at least one material selected from the group consisting of Ag, Al, Pt, Ni, Pd, Ti, Au, Ir, W, Sn, an oxide thereof, and a mixture thereof.

26. A method of manufacturing a semiconductor light-emitting device, the method comprising:

sequentially forming a first semiconductor layer, an active layer, and a second semiconductor layer on a first substrate;

forming a contact hole through which the first semiconductor layer is exposed from the second semiconductor layer, and forming a contact layer in the contact hole to be connected to the first semiconductor layer;

forming a second electrode layer on the second semiconductor layer to surround the contact hole;

forming a first insulating layer on the second electrode layer;

forming a first electrode layer on the first insulating layer to be connected to the contact layer in a second region other than a first region of the second electrode layer;

forming a second insulating layer to cover the first electrode layer;

forming a second electrode pad connected to the second electrode layer in the first region on the second insulating layer;

forming a first electrode pad in the second region to be spaced apart from the second electrode pad and to be connected to the first electrode layer;

forming a first contact and a second contact in a second substrate by filling through-holes spaced apart from each other in the second substrate with metals; and adhering the second substrate to the first contact and the second contact such that the first electrode pad and the second electrode pad are respectively connected to the first contact and the second contact.

27. The method of claim 26, further comprising forming a third insulating layer on inner circumferential surfaces of the through-holes and on a surface of the second substrate.

28. The method of claim 27, wherein the forming of the contact hole and the contact layer comprises forming a plurality of contact holes and a plurality of contact layers.

29. The method of claim 28, wherein the forming of the second electrode layer comprises:

forming a fifth insulating layer on the second semiconductor layer;

exposing the second semiconductor layer by removing a portion of the fifth insulating layer that surrounds the contact hole; and forming the second electrode layer on the exposed second semiconductor layer.

30. The method of claim 26, wherein the second substrate comprises any one selected from the group consisting of Si, Ge, Si containing Al, and GaN.

31. The method of claim 26, wherein the forming of the contact hole comprises:

forming a fourth insulating layer to cover the contact hole; and exposing the first semiconductor layer by etching a portion of the fourth insulating layer formed on a bottom of the contact hole, and the forming of the contact layer comprises forming the contact layer on the exposed first semiconductor layer.

32. The method of claim 26, wherein the second electrode layer comprises at least one material selected from the group consisting of Ag, Al, Pt, Ni, Pd, Ti, Au, Ir, W, Sn, an oxide thereof, and a mixture thereof.

33. The method of claim 26, wherein the forming of the first electrode layer comprises:

etching the first insulating layer to expose the contact layer; and forming the first electrode layer to cover the exposed contact layer.

34. A method of manufacturing a semiconductor light-emitting device, the method comprising:

sequentially forming a first semiconductor layer, an active layer, a second semiconductor layer, and a second electrode layer on a first substrate;

forming a contact hole through which the first semiconductor layer is exposed from the second electrode layer;

forming a first insulating layer on the second electrode layer to cover an inner circumferential surface of the contact hole;

exposing the first semiconductor layer by etching a portion of the first insulating layer formed on a bottom of the contact hole;

forming a first electrode layer on the first insulating layer to be connected to the contact layer in a second region other than a first region of the second electrode layer;

forming a second insulating layer to cover the first electrode layer;

forming a second electrode pad connected to the second electrode layer in the first region on the second insulating layer;

forming a first electrode pad in the second region to be spaced apart from the second electrode pad and to be connected to the first electrode layer;

forming a first contact and a second contact in a second substrate by filling through-holes spaced apart from each other in the second substrate with metals; and adhering the second substrate to the first contact and the second contact such that the first contact and the second contact are respectively connected to the first electrode pad and the second electrode pad.

35. A method of manufacturing a semiconductor light-emitting device, the method comprising:
forming a semiconductor structure by stacking a first semiconductor layer, an active layer, and a second semiconductor layer on a substrate;
forming a first electrode layer and a second electrode layer on a top surface of the semiconductor structure to be respectively electrically connected to the first semiconductor layer and the second semiconductor layer;
coating an insulating layer that exposes a part of a region where the first electrode layer is located and a part of a region where the second electrode layer is located;
forming a first electrode pad and a second electrode pad by plating a first electrode region through which the first electrode layer is exposed and a second electrode region through which the second electrode layer is exposed;
forming an insulating barrier by filling an insulating material in a boundary region between the first electrode pad and the second electrode pad; and
removing the substrate.

36. The method of claim 35, wherein the forming of the first electrode layer and the second electrode layer comprises:
forming at least one contact hole from the second semiconductor layer to the first semiconductor layer;
forming a passivation layer on the second semiconductor layer and the at least one contact hole;
exposing a portion of the first semiconductor layer by removing a portion of the passivation layer located on a bottom of the at least one contact hole;
forming a first electrode layer on the exposed portion of the first semiconductor layer;
removing a portion of the passivation layer other than a portion that surrounds the first electrode layer on the second semiconductor layer; and
forming a second electrode layer on an exposed area by the removing the portion of the passivation layer.

37. The method of claim 36, wherein the coating of the insulating layer comprises:
coating an insulating layer on entire top surfaces of the first electrode layer, the second electrode layer, and the semiconductor structure; and
removing a portion of the insulating layer where the first electrode layer and the second electrode layer are located.

38. The method of claim 37, wherein the forming of the first electrode pad and the second electrode pad comprises:
forming a photoresist in a boundary region between the first electrode region and the second electrode region;
forming the first electrode pad and the second electrode pad by performing plating with the photoresist therebetween; and
removing the photoresist.

39. The method of claim 38, wherein the forming of the first electrode pad and the second electrode pad further comprises forming a seed layer on the first electrode region and the second electrode region for performing the plating.

40. The method of claim 35, further comprising planarizing top surfaces of the first electrode, the second electrode, and the insulating barrier.

41. The method of claim 35, wherein the semiconductor structure is formed by stacking gallium nitride-based semiconductor layers.

42. The method of claim 35, wherein the substrate is a sapphire substrate.

43. A method of manufacturing a semiconductor light-emitting device, the method comprising:
forming a semiconductor structure by stacking a first semiconductor layer, an active layer, and a second semiconductor layer on a substrate;
forming a first electrode layer and a second electrode layer on a top surface of the semiconductor structure to be respectively electrically connected to the first semiconductor layer and the second semiconductor layer;
forming a first insulating layer that exposes a part of a region where the first electrode layer is located and a part of a region where the second electrode layer is located;
forming a second insulating layer that covers the first insulating layer, the first electrode layer, and the second electrode layer;
exposing a first region where the first electrode layer is located and a second region where the second electrode layer is located by etching the second insulating layer;
respectively forming a first metal layer and a second metal layer in the first region and the second region;
respectively forming a first electrode pad and a second electrode pad by plating the first metal layer and the second metal layer;
forming an insulating barrier by filling an insulating material in a boundary region between the first electrode pad and the second electrode pad; and
removing the substrate.

44. The method of claim 43, wherein the forming of the first electrode layer and the second electrode layer comprises:
forming at least one contact hole from the second semiconductor layer to the first semiconductor layer;
forming a passivation layer on the second semiconductor layer and the at least one contact hole;
exposing a portion of the first semiconductor layer by removing a portion of the passivation layer formed on a bottom of the at least one contact hole;
forming a first electrode layer on the exposed portion of the first semiconductor layer;
removing a portion of the passivation layer on the second semiconductor layer other than a portion that surrounds the first electrode layer; and
forming a second electrode layer on a portion exposed by the removing of the portion of the passivation layer.

45. The method of claim 43, wherein the coating of the first insulating layer comprises:
coating a first insulating layer on entire top surfaces of the first electrode layer, the second electrode layer, and the semiconductor structure; and
removing a portion of the first insulating layer where the first electrode layer and the second electrode layer are located.

46. The method of claim 45, wherein the forming of the first electrode pad and the second electrode pad comprises:
forming a photoresist in a boundary region between the first electrode region and the second electrode region;
forming the first electrode pad and the second electrode pad by performing plating with the photoresist therebetween; and
removing the photoresist.

47. The method of claim 46, wherein the forming of the first electrode pad and the second electrode pad further comprises forming a seed layer on the first electrode region and the second electrode region for performing the plating.

48. The method of claim 43, further comprising planarizing top surfaces of the first electrode, the second electrode, and the insulating barrier.

49. The method of claim 43, wherein the semiconductor structure is formed by stacking gallium nitride-based semiconductor layers.

50. The method of claim 43, wherein the substrate is a sapphire substrate.

* * * * *